(12) United States Patent
Hagiwara

(10) Patent No.: US 7,479,366 B2
(45) Date of Patent: Jan. 20, 2009

(54) METHOD FOR FORMING PATTERN

(75) Inventor: Takuya Hagiwara, Ibaraki (JP)

(73) Assignee: Renesas Technology Corp., Tokyo (JP)

( * ) Notice: Subject to any disclaimer, the term of this patent is extended or adjusted under 35 U.S.C. 154(b) by 742 days.

(21) Appl. No.: 10/974,813

(22) Filed: Oct. 28, 2004

(65) Prior Publication Data
US 2005/0100799 A1 May 12, 2005

(30) Foreign Application Priority Data
Nov. 6, 2003 (JP) ............... 2003-377439

(51) Int. Cl.
G03F 7/26 (2006.01)
G03F 1/00 (2006.01)
H01L 21/027 (2006.01)
(52) U.S. Cl. ............... 430/312; 430/5; 430/313; 438/761
(58) Field of Classification Search ............ 430/5, 430/311, 312, 313; 716/19–21; 438/761
See application file for complete search history.

(56) References Cited

U.S. PATENT DOCUMENTS 5,422,205 A    6/1995  Inoue et al.
5,523,258 A *  6/1996  Petti et al. ............... 438/585
6,905,800 B1 * 6/2005  Yuen et al. ............... 430/5
6,929,887 B1 * 8/2005  Lin et al. ............... 430/5
2002/0177054 A1* 11/2002 Saitoh et al. ............... 430/22
2003/0044059 A1*  3/2003 Chang et al. ............... 382/149
2003/0198878 A1* 10/2003 Minami ............... 430/22
2005/0031964 A1*  2/2005 Babich et al. ............... 430/5

FOREIGN PATENT DOCUMENTS

JP   7-211619      8/1995
JP   2001-324796   11/2001
JP   2002-189279   7/2002
JP   2003-248296   9/2003

* cited by examiner

Primary Examiner—Mark F Huff
Assistant Examiner—Jonathan Jelsma
(74) Attorney, Agent, or Firm—Leydig, Voit & Mayer, Ltd.

(57) ABSTRACT

In an exposure step, a combination of a first photomask and a second mask is used. The first mask has a real pattern corresponding to the pattern actually formed on the film to be processed, and a dummy pattern added for controlling pattern pitch in the first photomask within a prescribed range; and the second photomask has a pattern isolating a real-pattern-formed region from a dummy-pattern-formed region. In forming the pattern, after forming a film to be processed on a substrate, a first mask is formed on the film to be processed, by lithography, using the first photomask, and a second mask is formed on the film to be processed, by lithography, using the second photomask. Thereafter, the film to be processed is etched and removed using the first and second masks as masks to form the pattern.

7 Claims, 22 Drawing Sheets

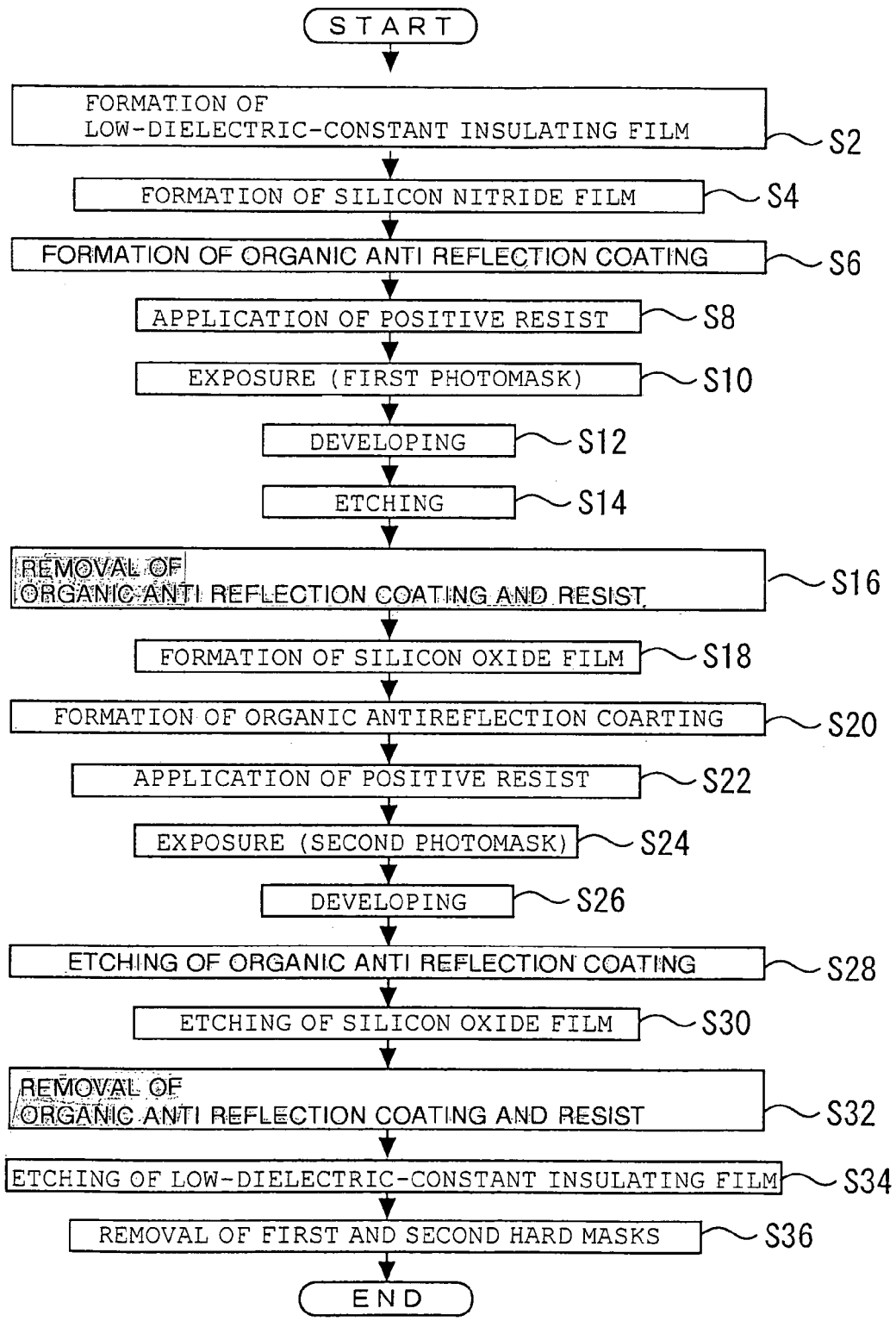

METHOD FOR FORMING PATTERN

BACKGROUND OF THE INVENTION

1. Field of the Invention

The present invention relates to photomasks, and a method for forming a pattern. More specifically, the present invention relates to photomasks used for forming fine patterns on a film to be processed using lithography, and a method for forming patterns using such photomasks.

2. Background Art

In recent years, with the high integration and miniaturization of semiconductor devices, the improvement of resolution in the photolithography has been demanded. In the photolithography, a critical resolution R, which is the critical pattern dimension that can be resolved, is represented by the following equation (1):

$$R = k_1 \cdot \lambda/(NA) \tag{1}$$

where $k_1$ is a constant dependent on image-forming conditions and resist conditions, $\lambda$ (nm) is the wavelength of exposing light, and NA is the numerical aperture of the taking lens.

Therefore, in order to improve resolution, the wavelength $\lambda$ of exposing light should be shortened, or the numerical aperture of the lens should be enlarged. However, the pattern size required by exposing techniques has been diminished, and the formation of patterns smaller than the realizable critical resolution R determined by the wavelength $\lambda$ of exposing light and the numerical aperture of the lens NA has been demanded.

For example, in a semiconductor device having a multilayer interconnection structure, the formation of a 1:1 line-and-space pattern (hereafter referred to as L/S pattern), which is the same as the gate pitch, is required in the area in the vicinity of the lowermost layer, that is, in the vicinity of the contact hole. For example, since the gate pitch is about 130 nm in the 65-nm technological node, the formation of the L/S pattern having this pitch is required in the vicinity of the lowermost layer of such a semiconductor device. However, it is difficult to cope with such a fine pattern only by shortening the wavelength and the enlarging numerical aperture.

Therefore, in order to form a pattern finer than the critical resolution R of the exposure apparatus, the combination of the technique known as resolution enhancement technique with shortening the wavelength and the enlarging numerical aperture has been considered. There are two techniques of resolution enhancement, for illumination and for the mask.

Specifically, the resolution enhancement for illumination is a technique using an off-axis illumination method. This method improves resolution by adding an aperture under the exposing light source, and for example, the annular illumination, which is one of the techniques of the off-axis illumination methods, by shielding the center portion of the luminous flux to decrease the image components by three-beam interference, and increase two-flux interference components.

On the other hand, a resolution enhancement technique for the mask uses a phase-shifting mask. While a conventional chromium mask controls only the amplitude of light, the phase-shifting mask improves resolution utilizing the phase contrast of light. The examples of phase-shifting masks include an attenuated phase-shifting mask and an alternating (Levenson-type) phase-shifting mask (e.g., refer to Japanese Patent Application Laid-Open No. 7-181668).

The combination of these two resolution enhancement techniques, i.e., off-axis illumination and the phase-shifting mask, is often used for the formation of fine patterns.

The off-axis illumination method depends on the layout of the pattern, considerably. For example, for only lines running in the vertical direction or in the horizontal direction, a dipole illuminating light source is effective for the strong contrast of light. When there are line patterns in both vertical and horizontal directions, a quadrapole illuminating light source is effective. Furthermore, when there are no limitations in the direction or the angle of the lines, annular illumination is effective.

The optimum location of the aperture depends on the pattern pitch of the cycle pattern. Therefore, the off-axis illumination method is particularly effective for cyclic patterns, but the effect is reduced unless the pattern pitch is made constant to some extent. For patterns that are not periodic, for example, a pattern having different pitches, an isolated pattern, or a pattern located in the end of cyclic pattern, the light intensity profiles become significantly different. Therefore, for patterns having no periodicity, resolution or focal depth is made worse rather than being improved as compared to the use of ordinary illumination.

As a measure for correcting dimensional differences in patterns that are not periodic, for example, the use of OPC (optical proximity correction) can be considered. However, although OPC is effective for the correction of dimensions, process margin, such as focal depth and exposure margin, is left unchanged.

FIG. 44 is a schematic diagram for illustrating a photomask whereon a pattern is formed. FIG. 45 is a graph for illustrating the relationship between defocus (μm) and the dimension (nm) of each transferred line pattern, when the pattern of the photomask is transferred.

Here, the photomask is an attenuated phase shifting mask having a transmittance of 5% whereon an L/S pattern of 130-nm pitch is laid out.

Here, since dimensional correction is performed by OPC, the dimensions of lines at best focus are substantially uniform, each other, as FIG. 45 shows. However, in the case of defocus, although the dimensions of Line 2 and Line 3 in the center portion in periodicity pattern are not changed, the dimensions of Line 1 in the end portion and isolated Line 4 are significantly changed to be smaller.

When the conventional off-axis illumination method or phase shifting masks are used, the process margin for the pattern out of periodicity is low, and even if dimensional correction by OPC is used, there is limitation in the accurate transfer of patterns. Therefore, in the pattern portion whereon a pattern out of periodicity is transferred, difference from the designed pattern dimension increases, and therefore, defects such as short-circuiting and disconnection often occur in this area, causing problems.

SUMMARY OF THE INVENTION

The present invention solves the above problems, and provides a photomask, and a method for forming patterns in order to transfer patterns more accurately to a film to be processed even when patterns out of periodicity are formed.

According to one aspect of the present invention, a pair of photomasks used in photolithography comprises a first photomask, and a second photomask. The first photomask comprises a real pattern and a dummy pattern. The real pattern is an actual pattern formed on a film to be processed. The dummy pattern added so as to control the pattern pitch of the first photomask to be within a prescribed range. The second photomask comprises a pattern isolating a region wherein the dummy pattern is formed from a region wherein the real pattern is formed.

According to another aspect of the present invention, in a method for forming patterns, a film to be processed is formed on a substrate, and a first and a second masks are formed on the film to be processed by lithography using a first and a second photomasks, respectively. The film to be processed is etched using the first mask and the second mask as masks. Here, the first photomask has a real pattern, which is an actual pattern formed on the film to be processed, and a dummy pattern added so as to control the pattern pitch in the first photomask to be within a prescribed range. The second photomask has a pattern isolating a region wherein the dummy pattern is formed from the region wherein the real pattern is formed.

Other and further objects, features and advantages of the invention will appear more fully from the following description.

BRIEF DESCRIPTION OF THE DRAWINGS

FIG. 3A illustrates the top surface, and FIG. 3B illustrates the cross section along the broken line IIIB-IIIB in FIG. 3A;

FIG. 4 is a flow diagram for describing the method for forming the trench patterns 24 in the first embodiment of the present invention;

DETAILED DESCRIPTION OF THE PREFERRED EMBODIMENTS

Figure 1:
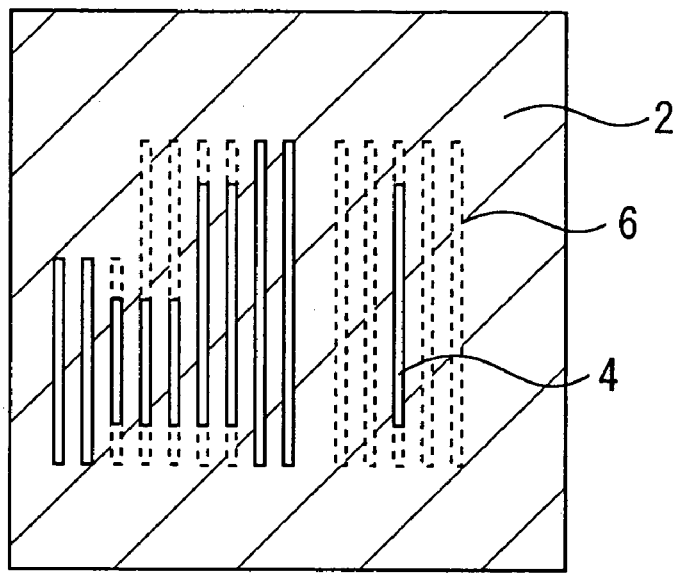
FIG. 1 is a top view for illustrating a first photomask in the first embodiment of the present invention.

The embodiments of the present invention will be described below referring to the drawings. In the drawings, the same or corresponding parts will be denoted by the same reference numerals, and the description thereof will be simplified or omitted.

First Embodiment

Figure 2:
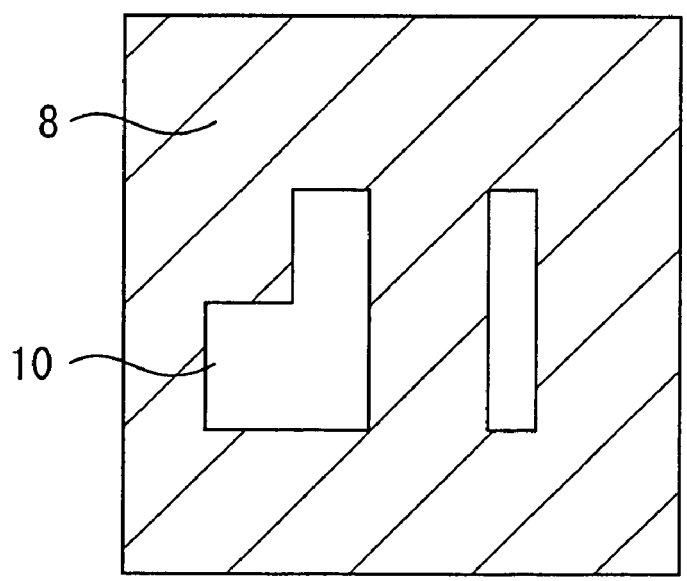
FIG. 2 is a top view for illustrating a second photomask in the first embodiment of the present invention.

FIG. 1 is a top view for illustrating a first photomask in the first embodiment of the present invention; and FIG. 2 is a top view for illustrating a second photomask in the first embodiment of the present invention.

As FIG. 1 illustrates, the first photomask is an attenuated phase shifting mask having a transmittance of 5%.

In the first photomask, a light-shielding portion 2 having a transmittance of 5%, real patterns 4 and dummy patterns 6, which are openings formed in the light-shielding portion 2, are formed. The real patterns 4 are patterns corresponding to trench patterns formed on the film subjected to processing; and the dummy patterns 6 are patterns added to the real patterns 4 so that the pitch of line patterns becomes constant to some extent in the entire first photomask 100. In the first photomask combining the real patterns 4 and the dummy patterns 6, a 1:1 line-and-space pattern (hereafter referred to as L/S pattern) of a pattern pitch of 130 nm is formed. Here, the pattern pitch means the distance from a line pattern to the adjacent line pattern, and here, it is the value of the width of a line pattern added to the width of the space between line patterns.

In the second photomask, a chromium light-shielding portion 8 and an opening portion 10 are formed. The opening portion 10 is formed so as to surround the region where the real patterns 4 of the first photomask are formed. The light-shielding portion 8 is formed so as to correspond to the peripheral light-shielding portion 2 where the pattern of the first photomask is not formed, and the area where the dummy patterns 6 are formed.

Specifically, when the first photomask is superimposed on the second photomask, only the area of the real patterns 4 is opened.

Figure 3A:
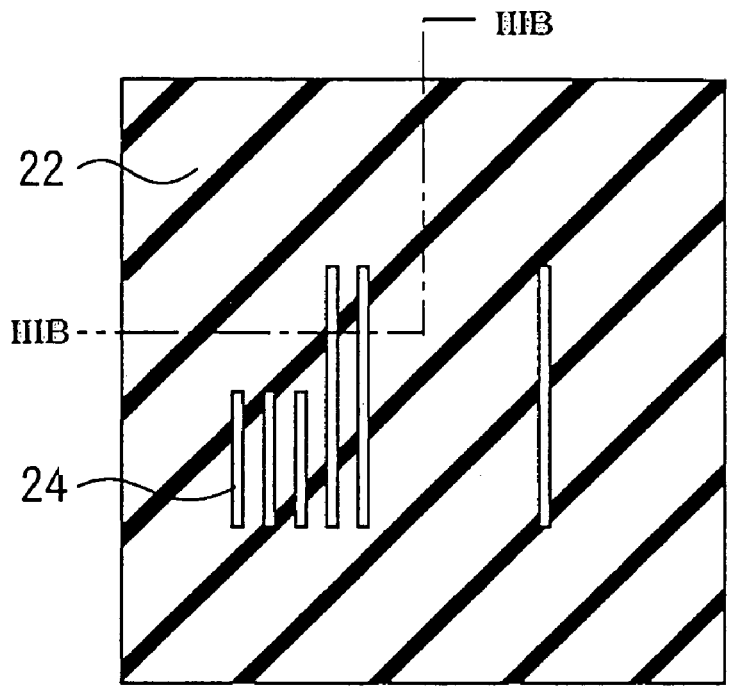
FIGS. 3A and 3B are schematic diagrams for illustrating the trench pattern formed using the first and second photomasks in the first embodiment of the present invention.
Figure 3B:
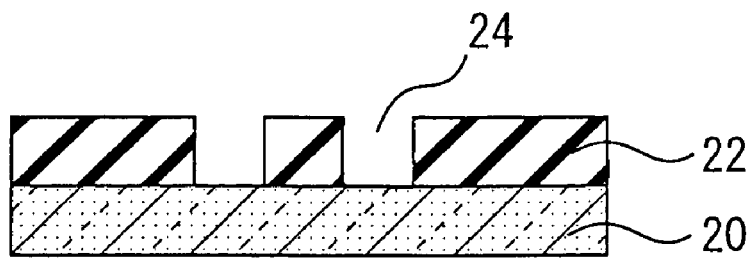

FIGS. 3(a) and 3(b) are schematic diagrams for illustrating the trench pattern formed using the first and second photomasks in the first embodiment of the present invention; and FIG. 3(a) illustrates the top surface, and FIG. 3(b) illustrates the cross section along the broken line A-A' in FIG. 3(a).

As FIG. 3A and 3B illustrate, a low- dielectric-constant insulating film 22 is formed on the substrate 20. The low-dielectric-constant insulating film 22 is a film to be processed in the first embodiment. In the low- dielectric-constant insulating film 22, trench patterns 24 are formed using the first and second photomasks.

As FIG. 3A illustrates, the trench patterns 24 are patterns that correspond to the real patterns 4 of the first photomask. In other words, the trench patterns 24 are patterns that correspond to the patterns formed when the first photomask is superimposed on the second photomask.

FIG. 4 is a flow diagram for describing the method for forming the trench patterns 24 in the first embodiment of the present invention. FIGS. 5 to 13 are schematic sectional views for illustrating the state of the trench patterns 24 in each forming step.

The method for forming the trench patterns 24 in the first embodiment of the present invention will be specifically described below referring to FIGS. 4 to 13.

Figure 5:
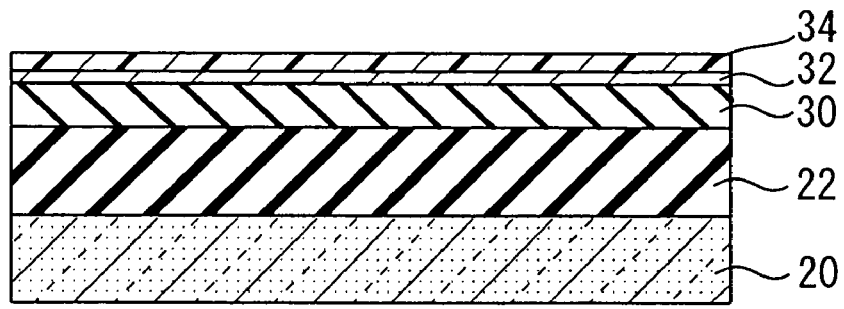
FIGS. 5 to 13 are schematic sectional views for illustrating the state of the trench patterns 24 in each forming step in the first embodiment of the present invention.

First, as FIG. 5 illustrates, a low-dielectric-constant insulating film 22 is vapor-deposited on the substrate 20 using plasma CVD (chemical vapor deposition) (Step S2). Next, a silicon nitride film 30 is vapor-deposited on the low-dielectric-constant insulating film 22 (Step S4). Here, the silicon nitride film 30 is formed to have a thickness of about 80 nm using plasma CVD method. The silicon nitride film 30 is a material film later patterned to be a first hard mask. Thereafter, an organic anti-reflection coating 32 is formed (Step S6), and a positive resist 34, which is a positive photosensitive material, is formed thereon (Step S8). As the resist 34, for example, a fluorine main-chain positive resist for $F_2$ lithography can be applied using spin coating.

Figure 6:
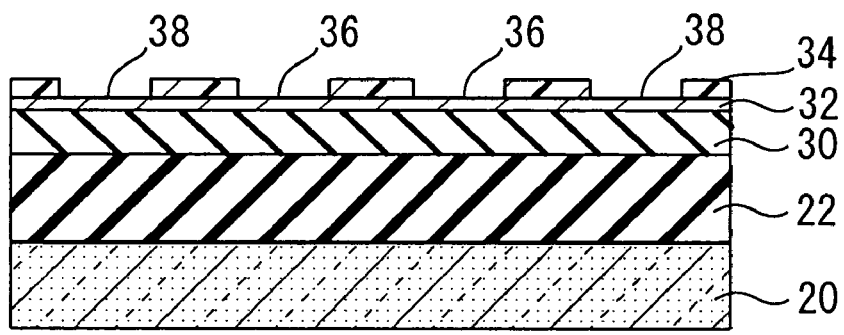

Next, as FIG. 6 illustrates, the positive resist 34 is exposed (Step S10). Here, a dipole illustration light source of a center sigma σ of 0.4 and the radius of σ of 0.05 using an $F_2$ excimer laser of a wavelength of 157.6 nm as the exposing light source is used. The numeral aperture NA of the lens is 0.95. As the photomask, the above-described first photomask is used.

Thereafter, a developing process is carried out (Step S12), and heat treatment is performed as required. Thereby, the patterns corresponding to the first photomask are transferred to the positive resist 34. In other words, openings (real) 36 corresponding to the real patterns 4, and openings (dummy) 38 corresponding to the dummy patterns 6 are formed in the positive resist 34.

Figure 7:
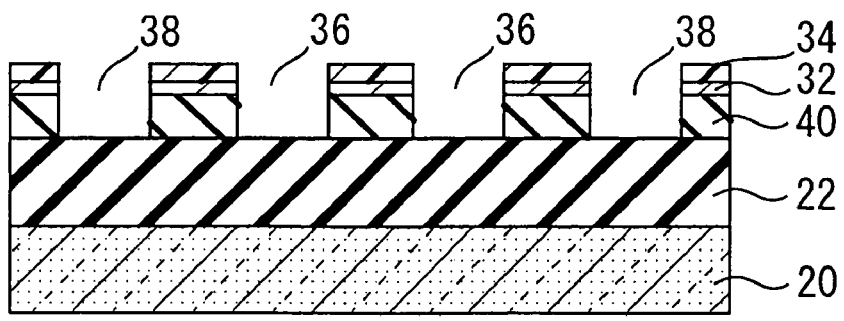

Next, as FIG. 7 illustrates, dry etching is performed using the patterns of the positive resist 34 as masks (Step S14). As the etching gas, for example, a mixed gas of carbon tetrafluoride, oxygen and argon is used. Thereby, the organic anti-reflection coating 32 and the silicon nitride film 30 are etched, and the openings 36 and 38 penetrate the organic anti-reflection coating 32 and the silicon nitride film 30 to expose the surface of the low-dielectric-constant insulating film 22 on the bottoms of the openings 36 and 38.

Next, the positive resist 34 and the organic anti-reflection coating 32 are removed (Step S16). Thereby, a first hard mask 40 composed of the silicon nitride film 30 is formed on.

Figure 8:
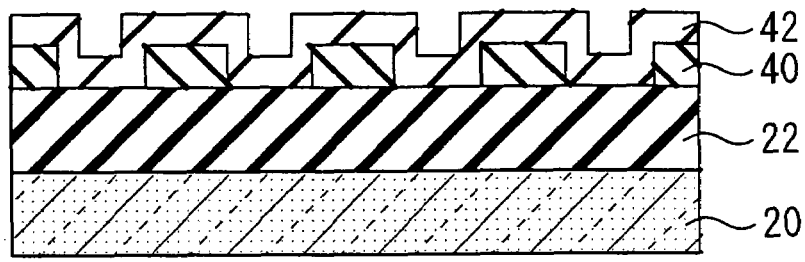

Next, as FIG. 8 illustrates, a silicon oxide film 42 is vapor-deposited on the first hard mask 40 and the low-dielectric-constant insulating film 22 (Step S18). The silicon oxide film 42 is formed using a plasma CVD method so as to have a thickness of about 30 nm. The silicon oxide film 42 is a material film later patterned to be a second hard mask.

Figure 9:
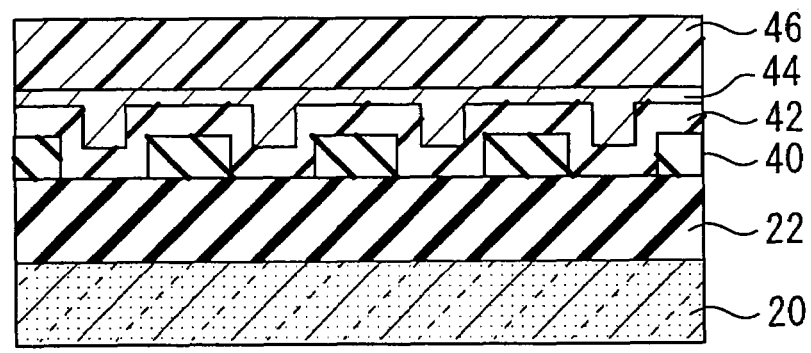

Next, as FIG. 9 illustrates, an organic anti-reflection coating 44 is formed on the silicon oxide film 42 (Step S20), and a positive resist 46 is applied thereto (Step S22). The positive resist 46 is a fluorine main-chain positive resist for $F_2$ lithography similar to the above-described positive resist 34, and can be applied using spin coating.

Figure 10:
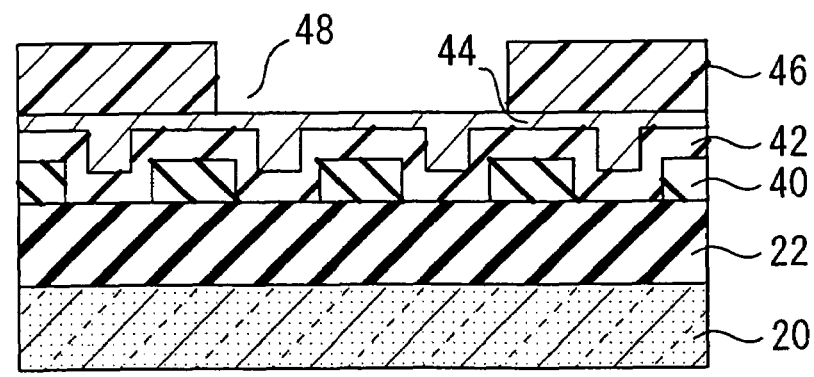

Next, the positive resist 46 is exposed (Step S24). Here, the exposure is performed using an $F_2$ excimer laser as the exposing light source, and using the above-described second photomask. Thereafter, a developing process is carried out (Step S26), and heat treatment is performed as required. Thereby, as FIG. 10 shows, an opening 48, which opens on the region where openings (real) 36 are formed, is formed in the positive resist 46. The opening 48 corresponds to the openings 10 of the second photomask.

Figure 11:
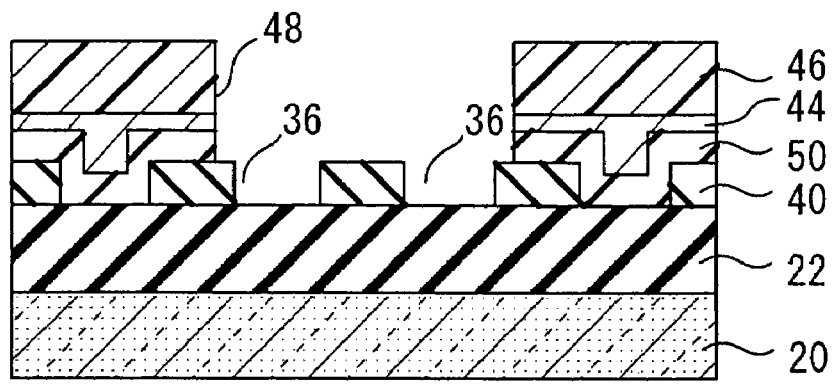

Next, as FIG. 11 shows, the organic anti-reflection coating 44 and the silicon oxide film 42 are subjected to dry etching using the positive resist 46 as a mask (Steps S28 and S30). Here, as the etching gas, for example, a mixed gas of cyclobutane octafluoride ($C_4F_8$), oxygen and argon is used. This etching gas provides a sufficient large etching selectivity between the silicon nitride film 30 and the silicon oxide film 42. Therefore, when the silicon oxide film 42 is etched using this gas, the first hard mask 40 can be left without being etched.

Figure 12:
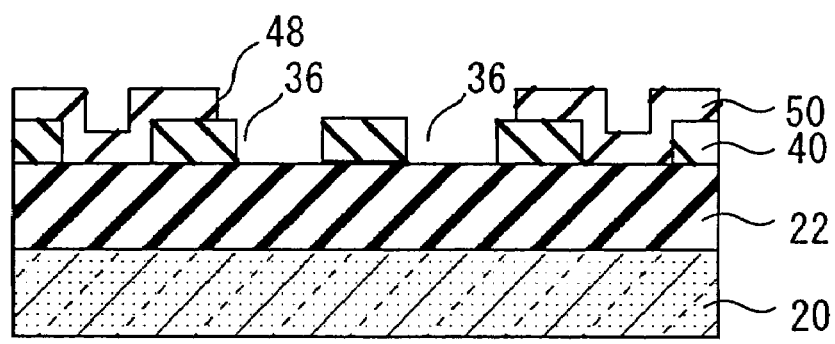

Next, the positive resist 46 and the organic anti-reflection coating 44 are removed (Step S32). Thereby, as FIG. 12 illustrates, a first hard mask 40 and a second hard mask 50 are formed on the low-dielectric-constant insulating film 22. Here, the openings to expose the surface of the low-dielectric-constant insulating film 22 are only openings (real) 36 that are portions corresponding to the real patterns 4 of the first photomask, and the openings (dummy) 38 of the first hard mask 40 are covered with the second hard mask 50.

Figure 13:
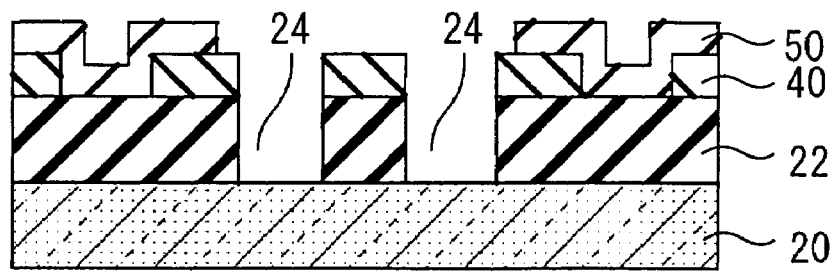

Next, as FIG. 13 illustrates, the low- dielectric- constant insulating film 22 is subjected to dry etching using the first hard mask 40 and the second hard mask 50 (Step S34). Thereafter, the first hard mask 40 and the second hard mask 50 are removed (Step S36). Thereby, as FIGS. 3A and 3B illustrate, trench patterns 24 are formed on the low-dielectric-constant insulating film 22.

In the first embodiment, as described above, the first photomask wherein the pattern pitch is uniformed by adding dummy patterns 6 to real patterns 4 was used as an attenuated phase shifting photomask, and a dipole illuminating light source was used for exposure. Thereby, periodical fine patterns can be accurately transferred on the resist 34, and a first hard mask 40 having pattern dimensions faithful to the pattern design can be formed.

Thereafter, a second hard mask 50 can be formed on the first hard mask 40 using the second photomask having an opening 10 only in the region where required real patterns 4 are formed. Here, the second photomask has a relatively simple pattern that partitions the region where real patterns 4 are formed from the region where dummy patterns 6 are formed, and therefore, the patterns can be relatively accurately transferred even using ordinary exposure.

In addition, using a two-layer hard mask formed by superimposing the second hard mask 50 on the first hard mask 40 as the mask, the low-dielectric-constant insulating film 22 can be etched.

Therefore, even when the pattern pitch is not periodical, or when there is an isolated pattern, resolution enhancement techniques, such as off-axis illumination and a phase shifting mask can be utilized in the portions where fine processing is required; therefore, fine patterns can be accurately formed.

In the first embodiment, although only two trench patterns 24 are shown in the drawing for simplification of description, a plurality of patterns can be formed in a plurality of locations as required.

The first and second photomasks are not limited to those shown in FIGS. 1 and 2. In the present invention, it is sufficient as long as the first photomask is formed by adding dummy patterns to real patterns so as to uniform the pattern pitch to some extent; and it is sufficient as long as the second photomask covers the dummy pattern portion of the first mask.

As the first photomask, an attenuated phase shifting mask was used. However, the present invention is not limited thereto, but for example, an alternating phase shifting mask may also be used. Depending on the size of patterns to be formed, a chromium mask may also be used. As the second photomask, a chromium mask was used. However, if the periodicity of the pattern on the second photomask is considered, a phase shifting mask as in the first photomask may also be used.

In the first embodiment, the case wherein a dipole illumination light source using an $F_2$ excimer laser was used for exposure in the formation of the first photomask 40 was described. However, the present invention is not limited thereto, and a light source have another wavelength may also be used. Further, the light source is not limited to a dipole illumination light source and another off-axis illumination light source, such as a quadrapole illumination light source and an annular illumination light source, may also be used, or a light source without deformation may also be used. Here, any of a dipole illumination light source, a quadrapole illumination light source, and a annular illumination light source is suitable for the formation of line patterns using an attenuated phase shifting mask as the first photomask, and the conditions of such light sources can be suitably selected considering the type, the pattern shape, the pattern size and the like of the first photomask.

In the first embodiment, a low-dielectric-constant insulating film 22 was used as a film to be processed. However, the present invention is not limited thereto, but can be applied to the patterning of other films.

In the first embodiment, the case wherein a silicon nitride film 30 was used as the first hard mask 40, and a silicon oxide film 42 was used as the second hard mask 50, was described. However, the present invention is not limited thereto, but other films may also be used. However, in the selection of the material for the hard masks, the films that have a large etching selectivity between the first hard mask and the film to be processed, and between the two hard masks, must be selected considering the etching conditions or the like.

In the first embodiment, the case wherein a fluorine main-chain positive resist for $F_2$ lithography is used as the positive resists 34 and 46. In the present invention, however, the resist is not limited thereto, but other resists can be used. An negative resist may also be used depending on the pattern of the photomask.

Further in the present invention, the method for forming each film, materials, etching conditions, and exposing conditions are not limited to those described for the first embodiment. These can be appropriately selected as required within the scope of the present invention.

Second Embodiment

Figure 14:
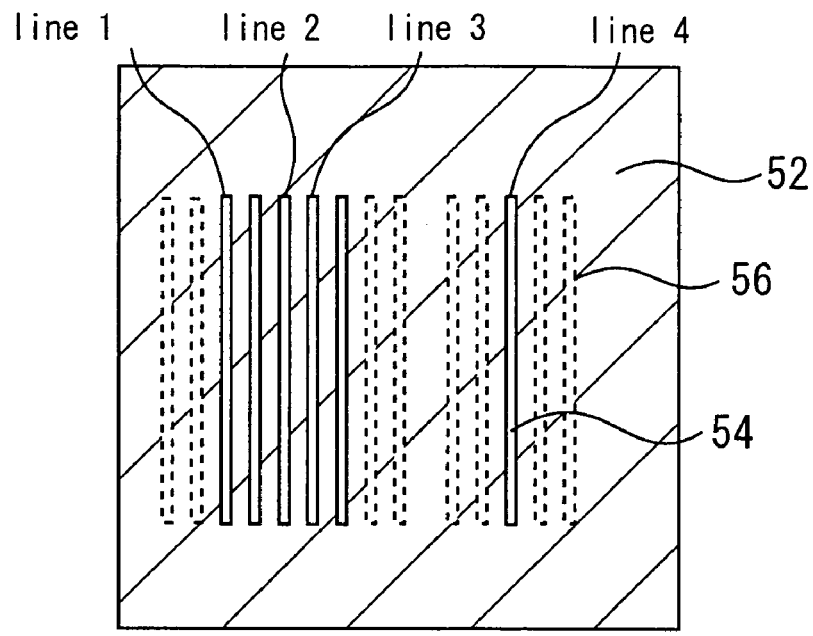
FIG. 14 is a top view for illustrating a first photomask in the second embodiment of the present invention.
Figure 15:
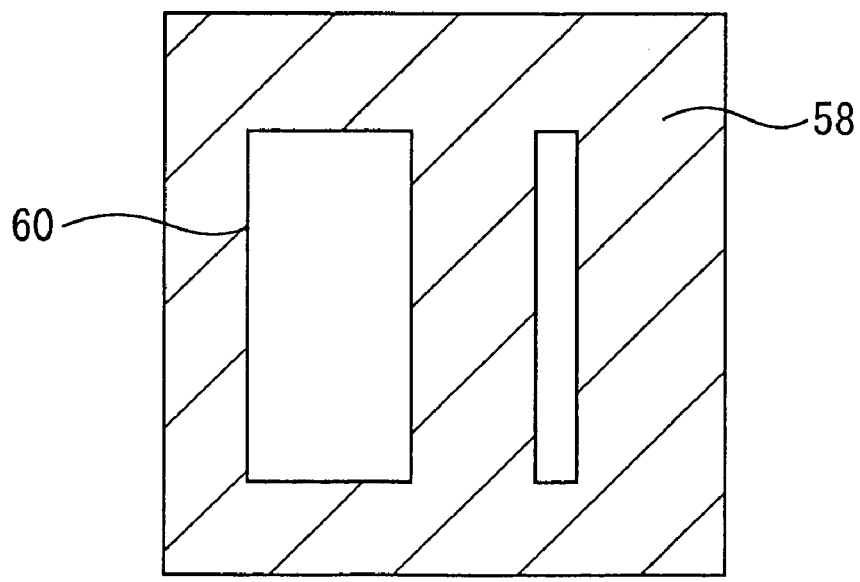
FIG. 15 is a top view for illustrating a second photomask in the second embodiment of the present invention.
Figure 16:
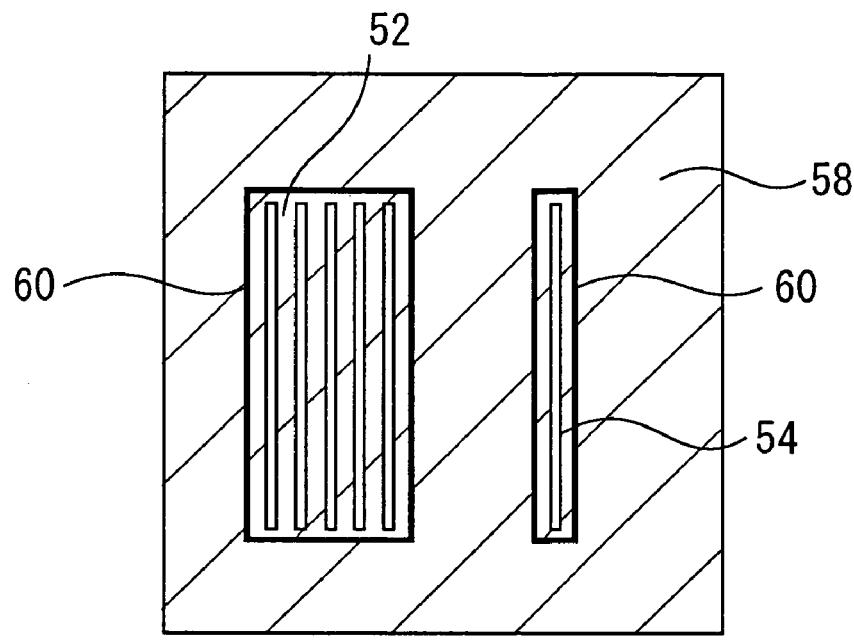
FIG. 16 is a schematic diagram for illustrating the state wherein the first photomask is superimposed on the second photomask in the second embodiment of the present invention.

FIG. 14 is a top view for illustrating a first photomask in the second embodiment of the present invention; and FIG. 15 is a top view for illustrating a second photomask in the second embodiment of the present invention. FIG. 16 is a schematic diagram for illustrating the state wherein the first photomask is superimposed on the second photomask.

As FIG. 14 illustrates, the first photomask in the second embodiment is an attenuated phase shifting mask. The first photomask is composed of a light-shielding portion 52, real patterns 54 corresponding to line patterns actually formed on the film to be processed, and dummy patterns 56 formed for adjusting the pattern pitch of the first photomask as a whole within a prescribed range.

As FIG. 15 illustrates, the second photomask has a light-shielding portion 58 and openings 60. The openings 60 are formed in the location surrounding the region where the real patterns 54 of the first photomask are formed. The light-shielding portion 58 is formed in the location that covers the dummy patterns 56 and the light-shielding portion 52 where no outer patterns are formed in the first photomask.

Therefore, when the second photomask is superimposed on the first photomask, the pattern wherein only the area of the real patterns 54 are opened is formed as FIG. 16 illustrates.

The method for forming fine patterns on a film to be processed in the second embodiment is the same as the method described for the first embodiment. Specifically, a first hard mask is formed on a film to be processed using a first photomask (Steps S4 to S16); thereafter, a second hard mask is formed on the first hard mask using the second photomask (Steps S18 to S32). Next, the film to be processed is etched using the first hard mask and the second hard mask (Step S34), and the first and second hard masks are removed (Step S36). Thereby, line patterns corresponding to the real patterns 54 can be formed on the film to be processed.

Figure 17:
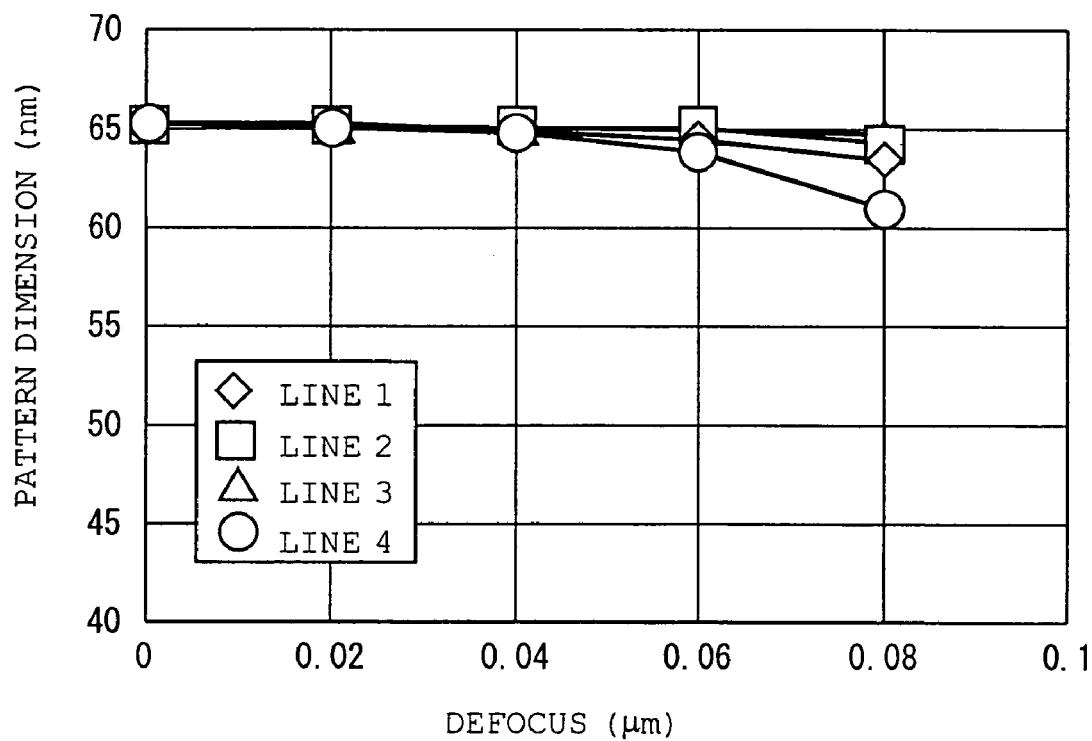
FIG. 17 is a graph for illustrating the relationship between defocus and the line size of the line patterns formed in the second embodiment of the present invention.

FIG. 17 is a graph for illustrating the relationship between the line size of the line patterns formed in the second embodiment and defocus; the ordinate showing the pattern size (nm) and the abscissa showing defocus (μm). In FIG. 17, lines indicated with Line 1 (plotted by lozenge "◇"), Line 2 (plotted by square "□"), Line 3 (plotted by triangle "△"), and Line 4 (plotted by circle "○") show line patterns to which Line 1, Line 2, Line 3, and Line 4 of the first photomask shown in FIG. 14 are transferred.

Figure 45:
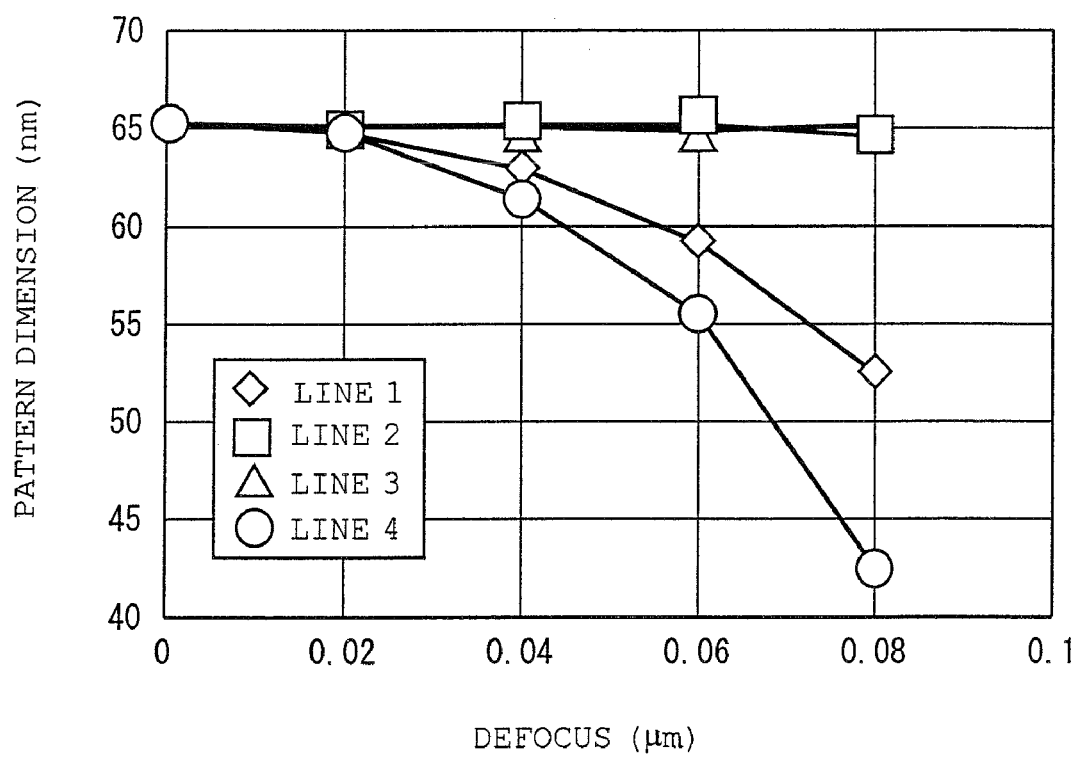
FIG. 45 is a graph for illustrating the relationship between defocus (μm) and the dimension (nm) of each transferred line pattern, when the pattern of the photomask as illustrated in FIG. 44 is transferred.

As FIG. 17 illustrates, according to the second embodiment, change in the size of the each of the formed lines is smaller compared with the conventional case shown in FIG. 45, even when a pattern having no periodicity, for example, the Line 1 on the end of real patterns 54, and the Line 4 located in the isolated area are defocused. Specifically, according to method to form the fine pattern in the second embodiment, it is seen that the focal depth is significantly improved even in the transfer of patterns having no periodicity in real pattern.

Since other parts are same as in the first embodiment, the description thereof will be omitted.

Third Embodiment

Figure 18:
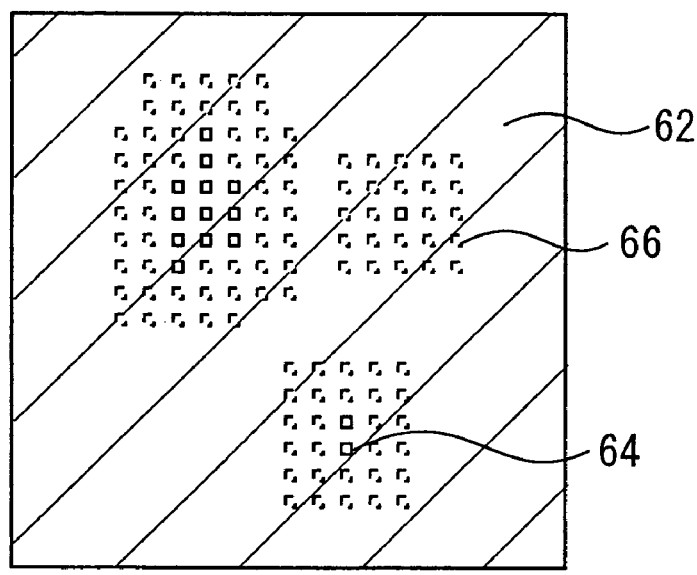
FIG. 18 is a top view for illustrating a first photomask in the third embodiment of the present invention.
Figure 19:
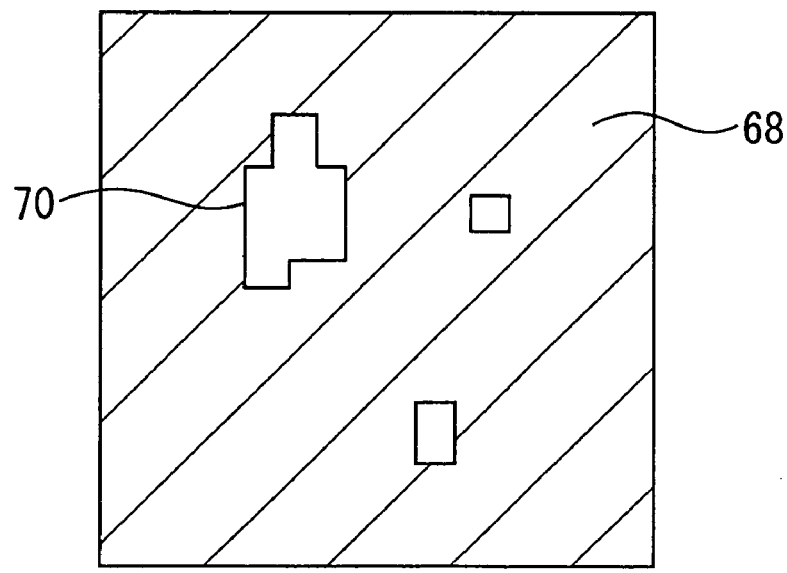
FIG. 19 is a top view for illustrating a second photomask in the third embodiment of the present invention.
Figure 20:
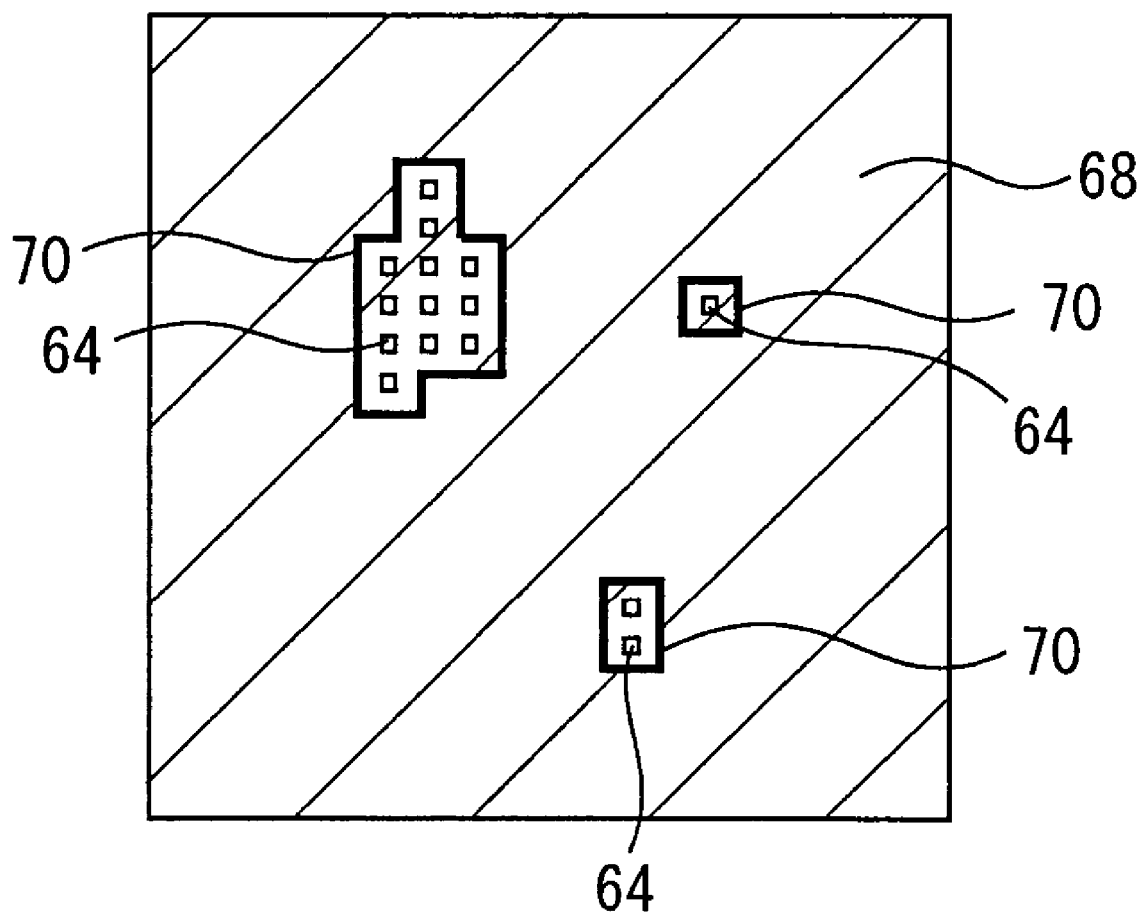
FIG. 20 is a schematic diagram for illustrating the state wherein the second photomask is superimposed on the first photomask according to third embodiment of the present invention.

FIG. 18 is a top view for illustrating a first photomask in the third embodiment of the present invention; and FIG. 19 is a top view for illustrating a second photomask in the third embodiment of the present invention. FIG. 20 is a schematic diagram for illustrating the state wherein the second photomask is superimposed on the first photomask.

As FIG. 18 illustrates, the first photomask in the third embodiment is an attenuated phase shifting mask having a transmittance of 5%. The first photomask is composed of a light-shielding portion 62, real patterns 64 corresponding to the patterns actually formed on the film to be processed, and dummy patterns 66 disposed for adjusting the pattern pitch overall the first photomask within a prescribed range. In the first photomask, hole patterns of a pattern pitch of 130 nm including the real patterns 64 and the dummy patterns 66 are formed.

As FIG. 19 illustrates, the second photomask in the third embodiment has a light-shielding portion 68 and openings 70. The openings 70 are formed so as to open on the regions where the real patterns 64 of the first photomask are formed. The light-shielding portion 68 is formed so as to cover the dummy patterns 66 and the surrounding light-shielding portion 62 of the first photomask.

Therefore, when the second photomask is superimposed on the first photomask, the pattern that opens only on the area of the real pattern 64, as FIG. 20 illustrates, is formed.

When a photomask having such hole patterns is used, the method for forming fine patterns on the film to be processed is the same as the method described in the first embodiment. The third embodiment will be described in detail below.

First, a low-dielectric-constant film as a film to be processed is formed on a substrate (Step S2). Thereafter, a first hard mask is formed on the low-dielectric-constant film using the first photomask in the third embodiment (Steps S4 to S16), and then, a second hard mask is formed on the low-dielectric-constant film and the first hard mask using the second photomask in the third embodiment (Steps S18 to S32). Thereafter, the low-dielectric-constant film is etched using the first hard mask and the second hard mask as masks (Step S34), and the first and second hard masks are removed. Thus, the hole patterns that correspond to the real patterns 64 of the first hard mask can be formed on the low-dielectric-constant film.

However, in the third embodiment, the thickness of the low-dielectric-constant film is 250 nm. In addition, the patterns to be formed are hole patterns. Therefore, when exposure using the first photomask having regularly arrayed hole patterns (Step S10) is performed, a quadrapole illumination light source of a center sigma (σ) of 0.4, and the radius of σ is 0.05 is used as an illumination light source.

As described above, also when the patterns to be processed are hole patterns, first, periodical patterns are accurately formed using a phase shifting mask and off-axis illumination, and then, a second hard mask that covers unnecessary areas is formed. Then, etching is performed using the first hard mask and the second hard mask as a double-layer mask. Thereby, accurate patterns can be formed even when the patterns to be formed are fine hole patterns.

In the third embodiment, the case wherein a quadrapole illumination light source is used as the illumination light source for forming hole patterns was described. However, as described for the first embodiment, the conditions of illumination are not limited thereto, but can be suitably selected considering the type, the pattern shape and the like of the first photomask.

Since other parts are the same as in the first embodiment, the description thereof will be omitted.

Fourth Embodiment

Figure 21:
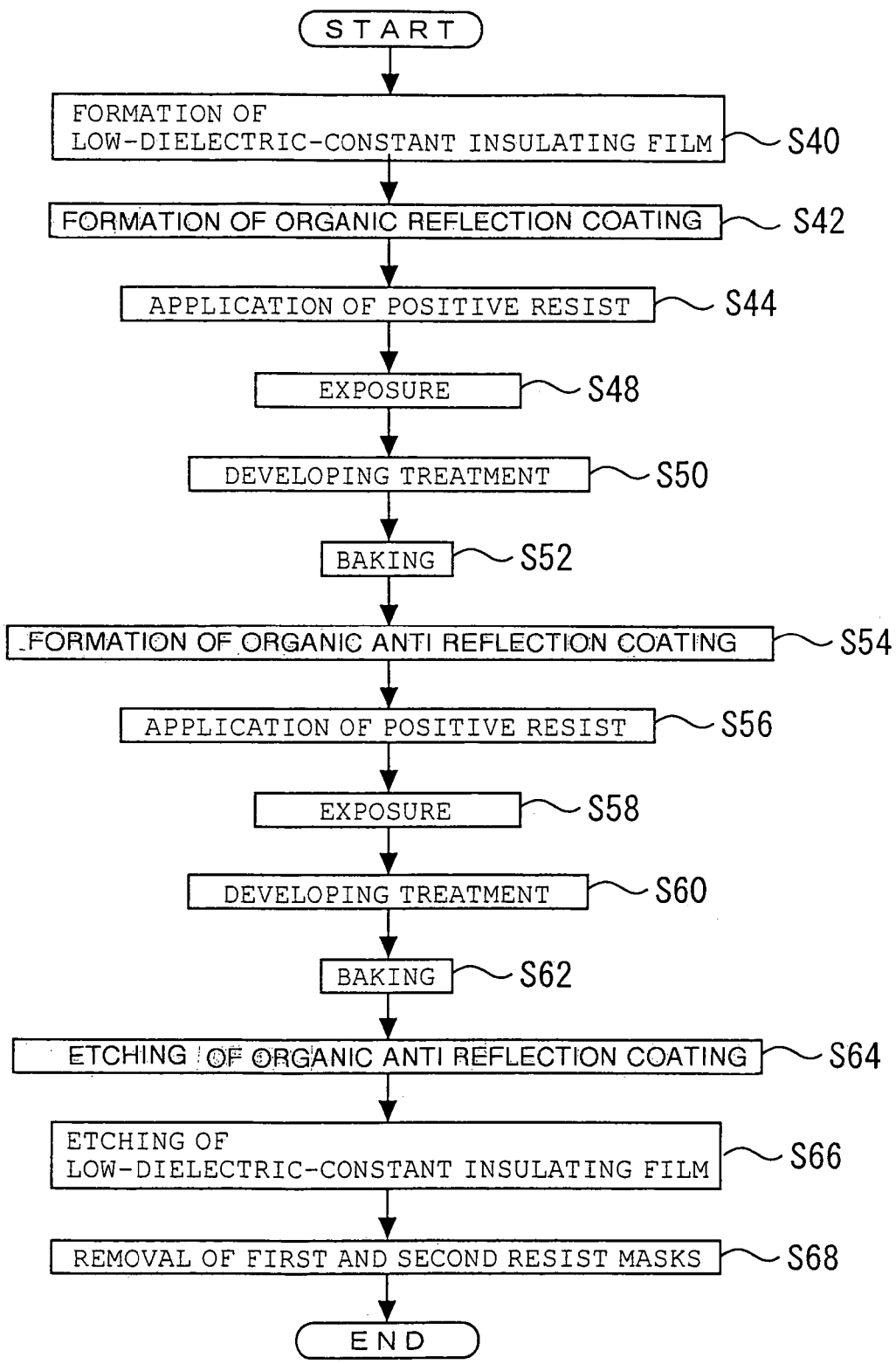
FIG. 21 is a flow diagram for illustrating the method for forming patterns according to the fourth embodiment of the present invention.

FIG. 21 is a flow diagram for illustrating the method for forming patterns according to the fourth embodiment of the present invention. FIGS. 22 to 27 are schematic sectional views for illustrating the states in the process for forming patterns according to the fourth embodiment of the present invention.

In the fourth embodiment, the photomasks used for forming patterns are the first and second photomasks similar to those described for the first embodiment. The fine patterns to be formed are also similar to the trench pattern 24 described for the first embodiment.

In the first embodiment, however, the first hard mask 40 and the second hard mask 50 are used in the etching of the low-dielectric-constant insulating film 22; while in the fourth embodiment, two layers of resist masks are used for etching. Specifically, a first resist mask is formed using the first photomask, a second resist mask is formed using the second photomask, and the low-dielectric-constant insulating film 22 is etched using these photomasks as masks. The fourth embodiment will be described below in detail.

Figure 22:
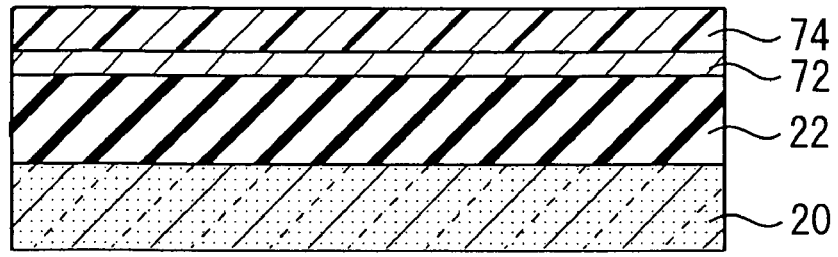
FIGS. 22 to 27 are schematic sectional views for illustrating the states in the process for forming patterns according to the fourth embodiment of the present invention.

First, as FIG. 22 illustrates, in the same manner as Step S2 of the first embodiment, a low-dielectric-constant insulating film 22, which is a film to be processed, is formed on a substrate 20 (Step S40). Thereafter, an organic anti-reflection coating 72 is formed on the low-dielectric-constant insulating film 22 (Step S42), and a positive resist 74 is spin-coated (Step S44). The organic anti-reflection coating 72 is selected from materials having a sufficiently large etching selectivity to the positive resist 74 considering subsequent etching conditions.

Figure 23:
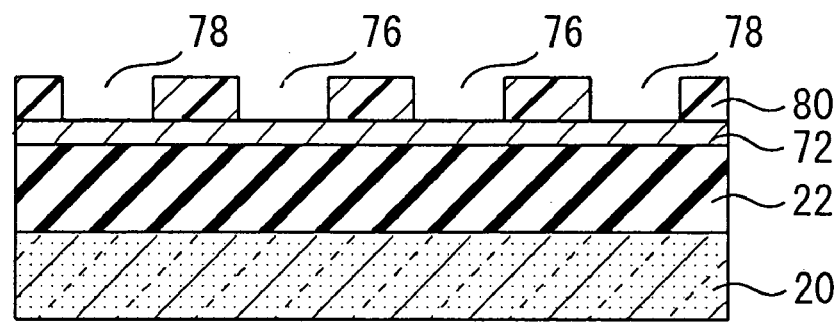

Thereafter, exposure, developing treatment, and baking are performed using the first photomask described for the first embodiment as the mask (Steps S48 to S52). Thereby, as FIG. 23 shows, the positive resist 74 is patterned, and the first resist mask 80 having openings (real) 76 and opening (dummy) 78 that correspond to the real patterns 4 and the dummy patterns 6 of the first photomask, respectively, are formed. Here, the exposure conditions and the like are the same as those described for the first embodiment.

Figure 24:
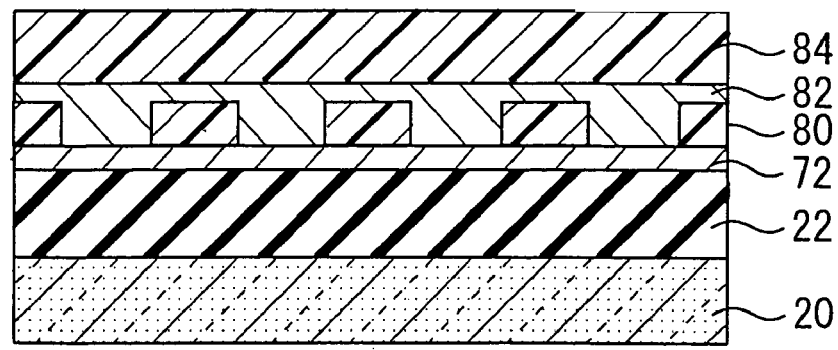
Figure 25:
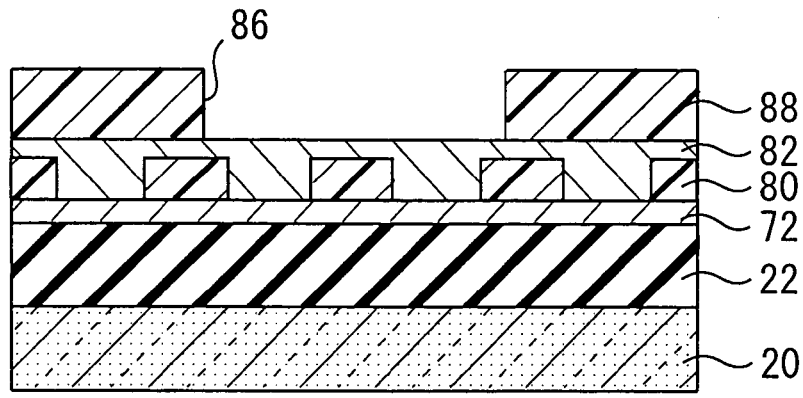

Next, as FIG. 24 illustrates, an organic anti-reflection coating 82 is formed on the first resist mask 80 and the organic anti-reflection coating 72 so as to bury openings 76 and 78 (Step S54). The first resist mask 80 is buried with the organic anti-reflection coating 82, so that there are no irregularities due to the first resist mask 80 on the surface of the organic anti-reflection coating 82. Here, the organic anti-reflection coating 82 is selected from materials having a sufficiently large etching selectivity to the first resist mask 80 considering subsequent etching conditions. The thickness of the organic anti-reflection coating 82 is a thickness that can sufficiently absorb light used for subsequent exposing step. Thereafter, a photoresist 84 is applied onto the organic anti-reflection coating 82 using spin coating (Step S56).

Next, exposure, developing treatment, and baking are performed using the second photomask described for the first embodiment as the mask (Steps S58 to S62). Here, the exposure conditions and the like are also the same as those described for the first embodiment. Thereby, a second resist mask 88 having an opening 86 that opens on the area of the openings (real) 76 of the first resist mask 80 is formed. Here, the organic anti-reflection coating 82 of a thickness that can sufficiently absorb exposure light is formed on the first resist mask 80. Therefore, in this exposure, the exposure of the first resist mask 80 together with the positive resist 84 can be prevented.

Figure 26:
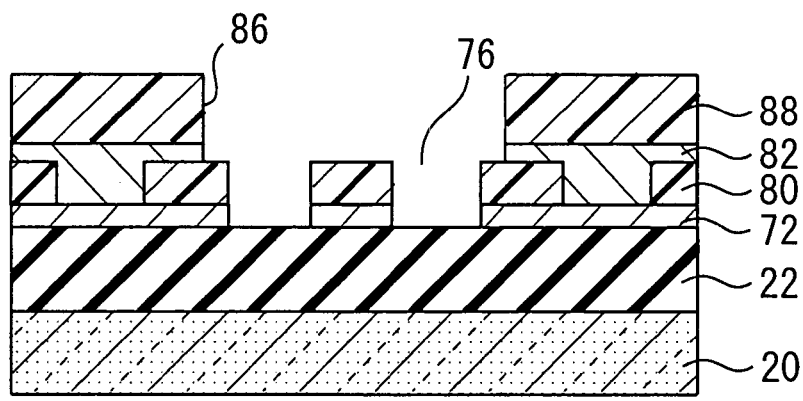
Figure 27:
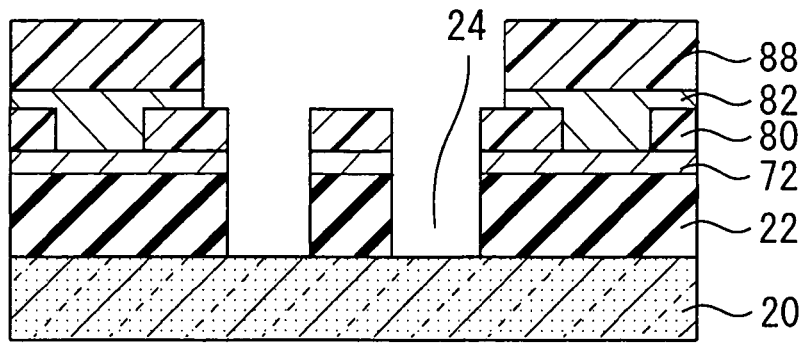

Next, as FIG. 26 illustrates, the organic anti-reflection coatings 72 and 82 that expose on the bottom of the opening 86 is etched using the second resist mask 88 as a mask (Step S64). Thereafter, the low-dielectric-constant insulating film 22 is etched using the first resist mask 80 and the second resist mask 88 as a mask (Step S66). Here, in the state of FIG. 26 wherein the first resist mask 80 and the second resist mask 88 overlap with each other, the surface of the low-dielectric-constant insulating film 22 is exposed only to openings (real) 76 that correspond to real patterns. Therefore, as FIG. 27 illustrates, the area of the openings (real) 76 is etched, and trench patterns 24 are formed in the low-dielectric-constant insulating film 22.

Thereafter, the first resist mask 80 and the second resist mask 88 are removed (Step S68). Thereby, fine patterns similar to those of the first embodiment shown in FIG. 3 can be formed.

In the fourth embodiment, as described above, resist masks are used in place of the hard masks. Therefore, in the first embodiment, after resist patterns have been once formed, the hard masks are etched off using the resist patterns as masks; while in the fourth embodiment, first and second resist masks are formed, and these resist masks are directly used as the masks for etching the low-dielectric-constant insulating film 22. Therefore, the number of steps for forming fine patterns can be reduced, and the throughput of semiconductor devices or liquid-crystal devices can be improved.

Also in the fourth embodiment, an attenuated phase shifting mask having a constant pattern pitch is used in the formation of the first resist mask, and a dipole illumination light source is used as the exposing light source. Therefore, the positive resist 72 can be accurately patterned. The second resist mask 88 is formed so as to cover the unnecessary area of the first resist mask 80. Therefore, with combination of the first and second photomasks, masks having fine patterns can be accurately formed, and accurate pattern formation can be performed.

In the fourth embodiment, an organic anti-reflection coating 82 is formed before applying the positive resist 84 for forming the second resist mask 88 (Step S54). Thus, by the formation of the organic anti-reflection coating 82, the irregularity formed by the first resist mask 80 can be planarized, and the positive resist 84 can be evenly applied. Furthermore, by the formation of the organic anti-reflection coating 82 having a sufficient thickness, the exposure light can be absorbed to prevent the simultaneous exposure of the first resist mask 80 in the exposure of the positive resist 84. Therefore, by the formation of the organic anti-reflection coating 82, the more accurate formation of fine patterns can be realized.

However, the present invention is not limited to the case wherein the organic anti-reflection coating 82 having a thickness to absorb exposure light is formed. In the present invention, for example, two types of resists having different photosensitivity can be used for the first resist mask 80 and the second resist mask 88, respectively. Thereby, the exposure of the first resist mask 80 can be prevented in the exposure when the second resist mask 88 is formed.

In the fourth embodiment, although resist masks are used together with the first and second masks, the present invention is not limited thereto. For example, the first hard mask 40 can be formed in the same manner as in the first embodiment (Steps S4 to S16) for only the first-layer mask that requires exposure and development of finer patterns; and the resist mask 88 as described for the fourth embodiment can be used for the second-layer mask. By so doing, in the formation of the second-layer mask having relatively small number of fine patterns, the step of etching the material film for the hard mask can be eliminated, and more accurate fine patterns can be formed while improving throughputs.

For example, generally when hard masks are used as in the first embodiment, the hard masks themselves can be relatively thinned if the etching selectivity of the hard mask to the film to be processed is selected to be large. Therefore, the film thickness of the resist used for forming the hard mask can also be thinned, and accurate exposure can be performed. Whereas, in order to directly process a relatively thick film to be processed using resist masks as in the fourth embodiment, the thickness of the resist must be secured to some extent. Therefore, the accuracy of fine processing is inferior to the accuracy in the first to third embodiments wherein hard masks are used. On the other hand, when resist masks are used, the number of steps can be reduced than the cases using hard masks.

Therefore, when fine patterns are formed, whether the use of hard masks, the use of resist masks, or the use of a hard mask as the first mask and a resist mask as the second mask can be selected considering accuracy necessary for pattern processing, productivity or the like.

Since other parts are the same as in the first embodiment, the description thereof will be omitted.

Fifth Embodiment

Figure 28:
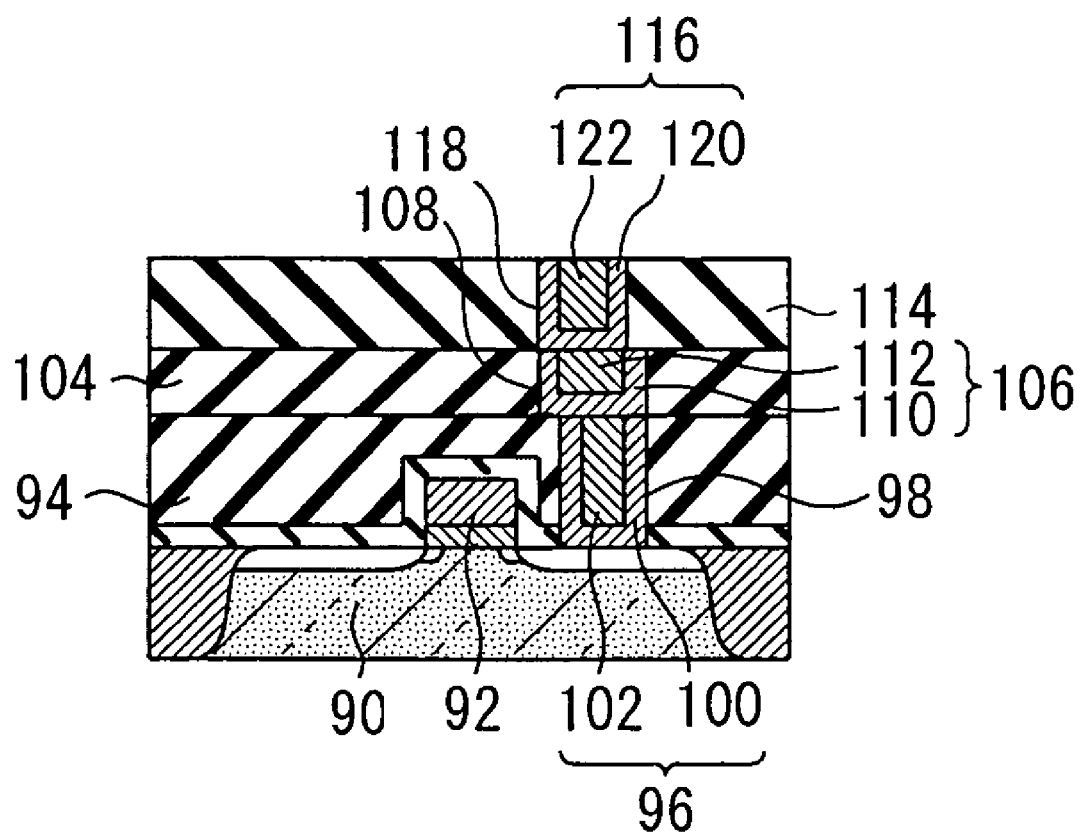
FIG. 28 is a schematic sectional view for illustrating the method for manufacturing a semiconductor device according to the fifth embodiment of the present invention.
Figure 29:
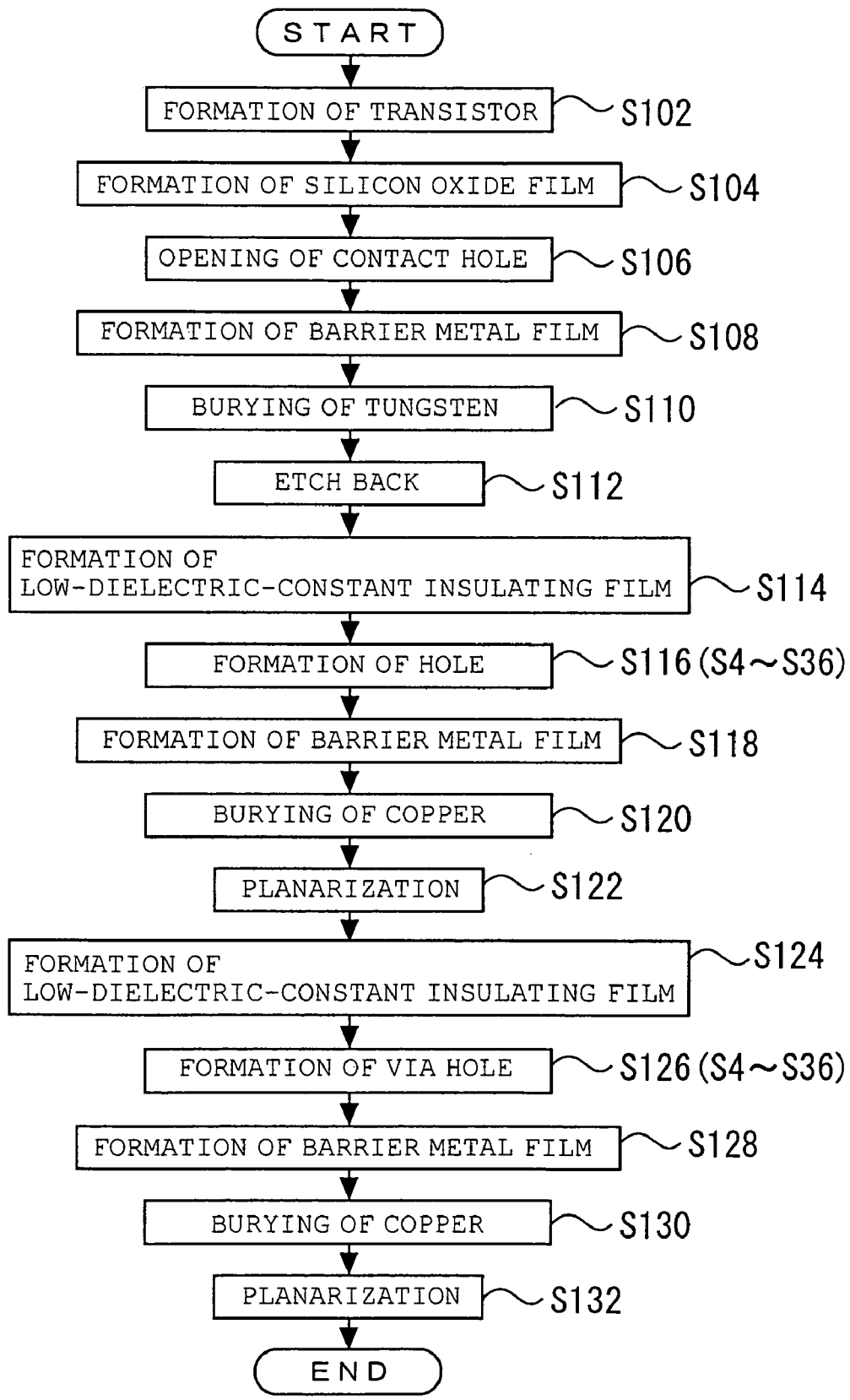
FIG. 29 is a flow diagram for illustrating the method for manufacturing the semiconductor device according to the fifth embodiment of the present invention.
Figure 30:
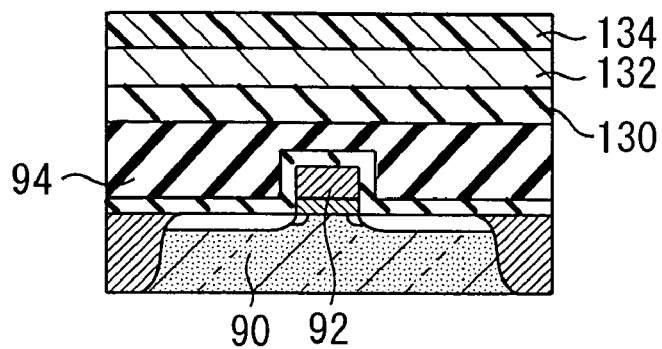
FIGS. 30 to 43 are schematic sectional views for illustrating the state in each step for manufacturing the semiconductor device according to the fifth embodiment of the present invention.

FIG. 28 is a schematic sectional view for illustrating the method for manufacturing a semiconductor device according to the fifth embodiment of the present invention. FIG. 29 is a flow diagram for illustrating the method for manufacturing the semiconductor device according to the fifth embodiment of the present invention. FIGS. 30 to 43 are schematic sectional views for illustrating the state in each step for manufacturing the semiconductor device according to the fifth embodiment of the present invention.

In the fifth embodiment, the semiconductor device having a interconnection structure formed by a single damascene process is manufactured using the methods for forming fine patterns in the first to fourth embodiments described above. The fifth embodiment will be specifically described referring to FIGS. 28 to 44.

As FIG. 28 shows, a transistor 92 is formed on the substrate 90 of the semiconductor device. A silicon oxide film 94 that covers the transistor 92 via a silicon nitride film is also formed on the substrate 90. The silicon oxide film 94 is an interlayer insulating film, and the thickness thereof is about 600 nm. In the silicon oxide film 94 is formed a contact plug 96 extending to the source-drain region of the transistor 92. The contact plug 96 is composed of tungsten 102 buried in the contact hole 98 through a barrier metal 100 consisting of a titanium nitride layer and a titanium layer.

A low-dielectric-constant insulating film 104 is formed on the silicon oxide film 94. The thickness of the low-dielectric-constant insulating film 104 is about 130 nm. Passing through the low-dielectric-constant insulating film 104, a metal wiring 106 that is connected to the contact plug 96 is formed. The metal wiring 106 is composed of copper (Cu) 112 buried in the hole 108 through a barrier metal 110 consisting of a tantalum nitride layer and a tantalum layer.

A low-dielectric-constant insulating film 114 is formed on the low-dielectric-constant insulating film 104. The thickness of the low-dielectric-constant insulating film 114 is about 250 nm. Passing through the low-dielectric-constant insulating film 114, a via plug 116 that is connected to the metal wiring 106 is formed. The via plug 116 is composed of copper 122 buried in the via hole 118 through a barrier metal 120 consisting of a tantalum nitride layer and a tantalum layer.

When the semiconductor device constituted as described above is manufactured, required openings in the silicon oxide film 94, and the low-dielectric-constant insulating films 104 and 114 are formed using the methods described for the first to fourth embodiments. This will be specifically described below.

First, a gate, a source-drain region, and the like are formed on the substrate 90 to form the transistor 92 (Step S102).

Next, the silicon oxide film 94, which is an interlayer insulating film that covers the transistor 92 via a silicon nitride film thereon, is formed on the substrate 90 (Step S104). Here, a silicon oxide film 94 is deposited using a plasma CVD method, and is planarized using CMP. Planarization is performed so that the thickness of the silicon oxide film 94 from the surface of the substrate 90 becomes about 600 nm after planarization.

Next, the contact hole 98 is formed in the silicon oxide film 94 (Step S106). The contact hole 98 is formed using the method described for the fourth embodiment.

In the same manner as in Steps S4 to S16 of the first embodiment, a first hard mask is formed. Specifically, as FIG.

Figure 31:
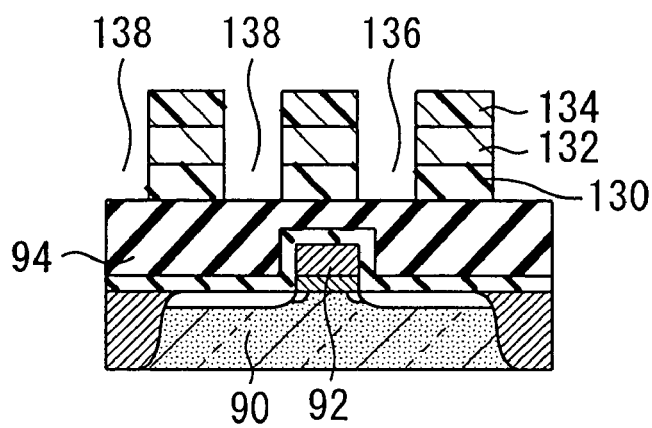

30 illustrates, a silicon nitride film 130 of a thickness of 80 nm, an organic anti-reflection coating 132, and a positive resist 134 are formed on the silicon oxide film 94 of the first embodiment. Thereafter, the positive resist 134 is exposed and developed using a first photomask. Here, as the first photomask, a photomask having real patterns that correspond to the contact hole 98, and dummy patterns arranged for adjusting the pattern pitch and density is used. Furthermore, as illustrated in FIG. 31, the organic anti-reflection coating 132 and the silicon nitride film 130 are etched using the positive resist film 134 as a mask. Then, the positive resist 134 and the organic anti-reflection coating 132 are removed. Thereby, there is formed a first hard mask 140 having an opening (real) 136 on the location where the contact hole 98 is formed, and openings (dummy) 138 corresponding to dummy patterns of the first mask.

Figure 32:
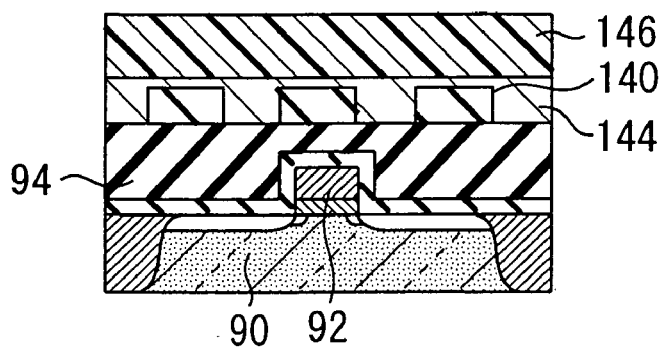
Figure 33:
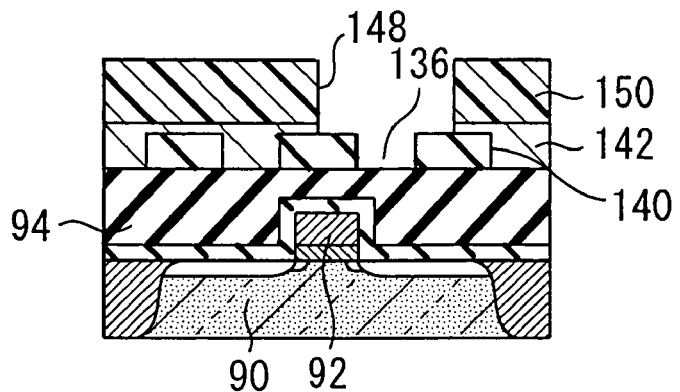

Next, in the same manner as in Steps S54 to S64 of the fourth embodiment, a second resist mask is formed. Specifically, as FIG. 32 illustrates, an organic anti-reflection coating 144 is formed on the silicon oxide film 94 and the first hard mask 140. The organic anti-reflection coating 144 is formed so as to cover the irregularity of the first hard mask 140 to planarize the surface to some extent. Thereafter, a positive resist 146 is formed on the organic anti-reflection coating 144. Next, the positive resist 146 is exposed and developed using the second photomask. As the second photomask, a photomask having an opening in the location surrounding the region where the real patterns of the first photomask are formed, and a light-shielding portion in the location that corresponds to the region where the dummy patterns are formed is used. Thereafter, as FIG. 33 illustrates, the organic anti-reflection coating 144 is etched using the positive resist 146 as a mask. Thereby the second resist mask 150 having an opening 148 on the opening (real) 136 is formed.

Figure 34:
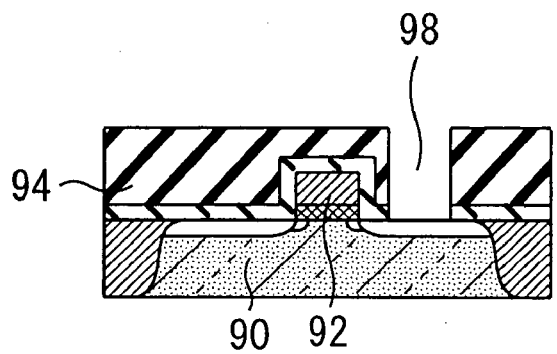

Next, the silicon oxide film 94 is etched using the first hard mask 140 and the second resist mask 150 as masks, and after etching, the first hard mask 140 and the second resist mask 150 are removed. Thereby, as FIG. 34 illustrates, a contact hole 98 is formed in the silicon oxide film 94.

Figure 35:
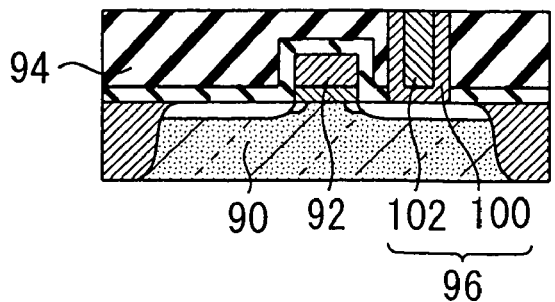

Next a two-layer film of titanium and titanium nitride is deposited as a barrier metal 100 in the contact hole 98 (Step S108). Further, tungsten 102 is buried in the contact hole 98 (Step Silo), and etched back so as to expose the silicon oxide film 94 on the surface (Step S112). Thereby, as FIG. 35 illustrates, a contact plug 96 connected to the source-drain region is formed in the silicon oxide film 94.

Next, a low-dielectric-constant insulating film 104 is formed on the silicon oxide film 94 (Step S114). The low-dielectric-constant insulating film 104 is deposited using a plasma CVD method to have a thickness of 130 nm. Thereafter, fine holes are formed in the low-dielectric-constant insulating film 104 (Step S116). For the formation of the fine holes, the method for forming patterns described for the first embodiment is used.

Specifically, first, a first hard mask is formed on the low-dielectric-constant insulating film 104 in the same manner as in Steps S4 to S16 of the first embodiment. Here, after forming a silicon nitride film 230 of a thickness of 80 nm on the low-dielectric-constant insulating film 104 as the material film for the first hard mask, the organic anti-reflection coating 232 and the positive resist 234 are formed on the silicon nitride film 230. Thereafter, exposure is performed using the first photomask as a mask. Here, the photomask having real patterns that correspond to the holes 108, and dummy patterns arranged for uniforming the pattern pitch and density on the entire photomask is used as the first photomask. Here, similar to the third embodiment, a quadrapole illumination light source of a center sigma (σ) of 0.4, and the diameter of σ of 0.05, using an $F_2$ excimer laser of a wavelength of 157 nm as a exposing light source, is used. The numerical aperture NA of the lens is 0.95.

Figure 36:
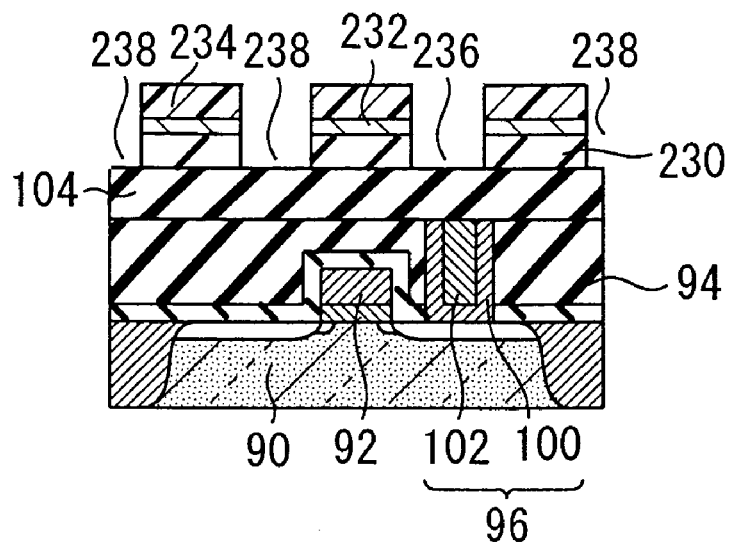

Thereafter, the developing treatment of the positive resist 234 is performed to form a resist pattern, and the organic anti-reflection coating 232 and the silicon nitride film 230 are etched using the resist pattern as a mask. Thereby, as FIG. 36 illustrates, an opening (real) 236 that corresponds to the hole 108, and openings (dummy) 238 for uniforming the pattern pitch are formed. Thereafter, the positive resist 234 and the organic anti-reflection coating 232 are removed (Step S16). Thereby, a first hard mask 240 is formed on the low-dielectric-constant insulating film 104.

Figure 37:
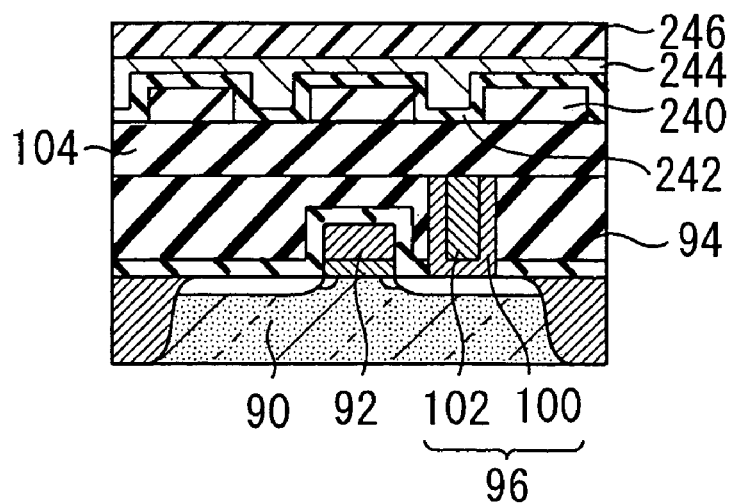

Next, as FIG. 37 illustrates, a second hard mask is formed on the low-dielectric-constant insulating film 104 in the same manner as in Steps S18 to S32 of the first embodiment. Here, a silicon oxide film 242 of a thickness of 30 nm is formed on the surfaces of the low-dielectric-constant insulating film 104 and the first hard mask 240 as the material film for the second hard mask, and an organic anti-reflection coating 244 and the positive resist 246 are formed thereon.

Figure 38:
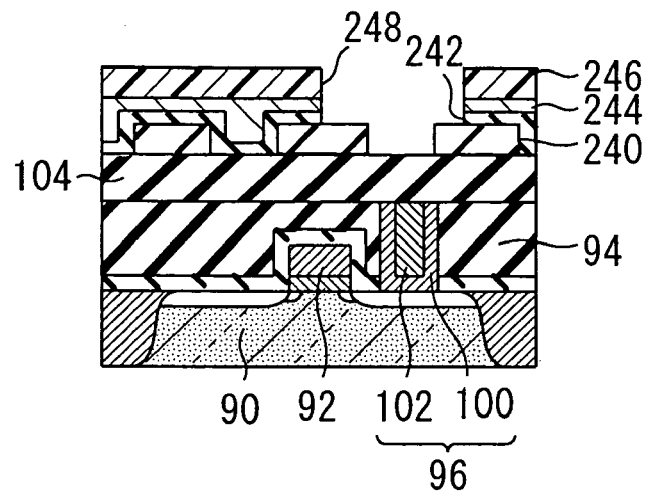

Next, exposure treatment is performed. The second photomask used here is a chromium mask, which isolates the real patterns from dummy patterns in the first hard mask to open only the area of real patterns. After exposure, developing treatment is performed to form resist patterns, and the organic anti-reflection coating 244 and the silicon oxide film 242 are etched using the resist patterns as masks. Thereby, as FIG. 38 illustrates, an opening 248 is formed on the opening (real) 236. Thereafter, the positive resist film 246 and the organic anti-reflection coating 244 are removed. Thereafter, the positive resist 244 and the organic anti-reflection coating 246 are removed Thereby, the second hard mask 250 is formed.

Figure 39:
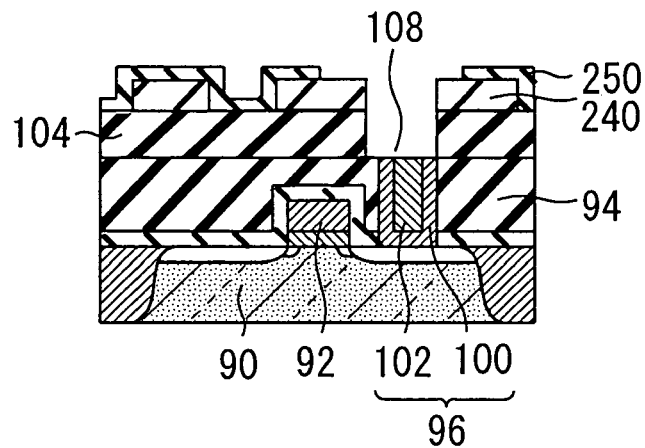

Next, as FIG. 39 illustrates, the low-dielectric-constant insulating film 104 is etched using the first hard mask 240 and the second hard mask 250 as masks. Thereafter, the first and second hard masks 240 and 250 are removed. Thereby, a hole 108 is formed in the low-dielectric-constant insulating film 104.

The conditions of exposure, etching or the like for forming the hole 108 are the same as those in the first embodiment unless otherwise specified.

Figure 40:
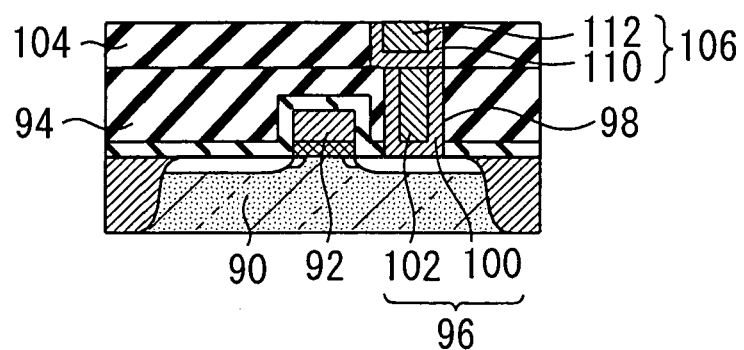

Next, a barrier metal 110 is formed on the inner wall of the hole 108 (Step S18). The barrier metal 110 is formed by vapor-depositing the two-layer film of tantalum nitride and tantalum using plasma CVD. Thereafter, copper 112 is buried in the hole 108 using an electrolytic plating method (Step S120), and is planarized using CMP (Step S122). Thereby, as FIG. 40 illustrates, a metal wiring 106 to be connected to the contact plug 96 is formed in the low-dielectric-constant insulating film 104.

Next, a low-dielectric-constant insulating film 114 is formed on the low-dielectric-constant insulating film 104 (Step S124). The low-dielectric-constant insulating film 114 is accumulated using a plasma CVD method to have a thickness of about 250 nm. Thereafter, a via hole 118 is formed in the low-dielectric-constant insulating film 114 (Step S126). In the formation of the via hole 118, the same methods as in Steps S4 to S36 in the first embodiment are used similar to the formation of the hole 108.

Figure 41:
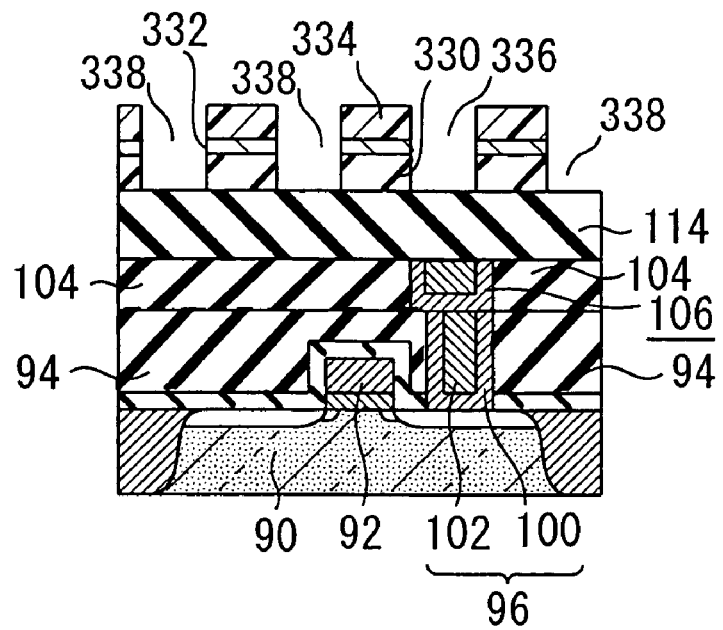

Specifically, a silicon nitride film 330, an organic anti-reflection coating 332, and a positive resist 334 are formed on the low-dielectric-constant insulating film 114. Thereafter, exposure and developing treatment is performed using the first photomask having real patterns that correspond to the via hole 118 and dummy patterns for controlling the pattern pitch, and, as illustrated in FIG. 41, further etching or the like of the organic anti-reflection coating 332 and the silicon nitride film 330 are performed using the positive resist 334 as a mask. Thus, the first hard mask 340 having an opening (real) 336 that corresponds to real patterns and openings (dummy) 338 that corresponds to dummy patterns is formed.

Figure 42:
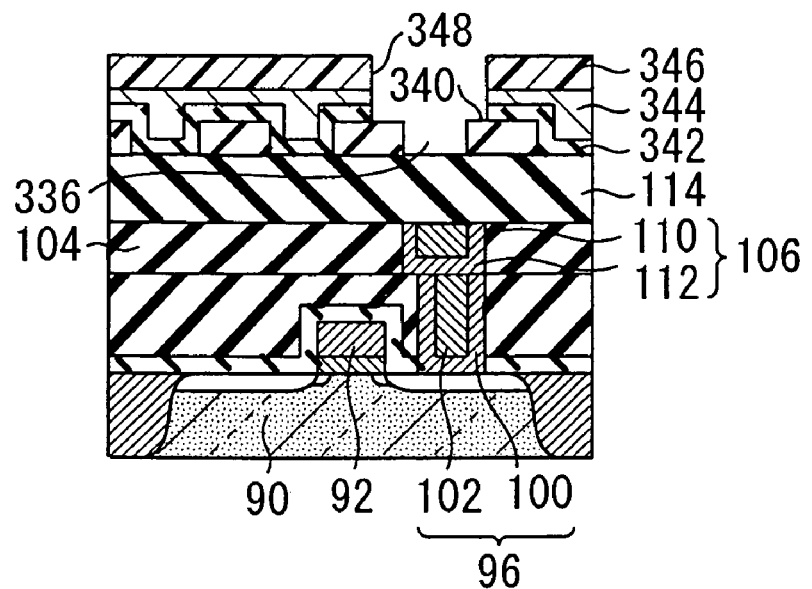

After removing the positive resist 334 and the organic anti-reflection coating 332, a silicon oxide film 342, an organic anti-reflection coating 344, and a positive resist 346 are formed on the low-dielectric-constant film 114 and the first hard mask 340, and the positive resist 346 is exposed and developed using the second photomask. Furthermore, as FIG. 42 illustrates, the organic anti-reflection coating 344 and the silicon oxide film 342 are etched using the positive resist 346 as the mask to form an opening 348. Thus the second hard mask 350 having an opening 348 that opens on the region where the opening (real) 336 is formed and that covers the region where the openings (dummy) 338 are formed is formed.

Figure 43:
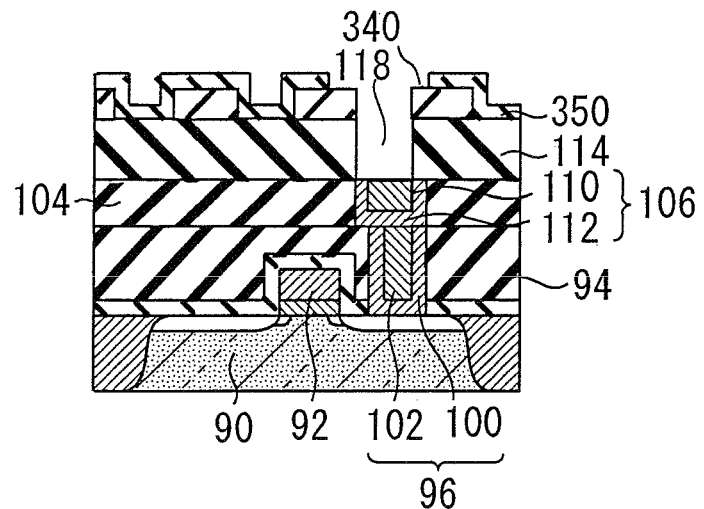
Figure 44:
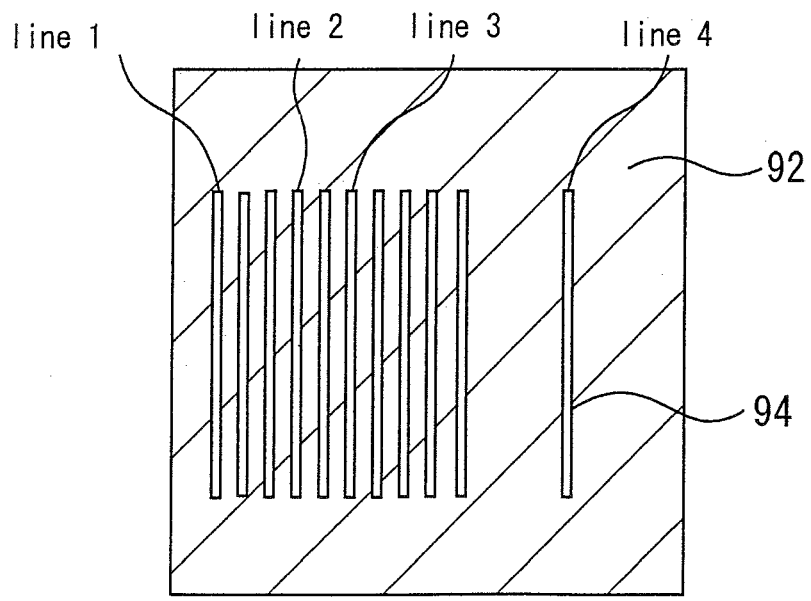
FIG. 44 is a schematic diagram for illustrating a conventional photomask whereon a pattern is formed.

After removing the positive resist 346 and the organic anti-reflection coating 344, as FIG. 43 illustrates, the low-dielectric-constant insulating film 114 is etched using the first and second hard masks 340 and 350 as masks, and then, the first and second hard masks 340 and 350 are removed after forming the via hole 118.

The conditions of exposure, etching or the like for forming the via hole 118 are the same as those in the first embodiment unless otherwise specified.

Next, a barrier metal 120 consisting of a two layer film of tantalum nitride and tantalum is formed on the inner wall of the via hole 118 (Step S128), copper is buried using electrolytic plating (Step S130), and planarized using CMP (Step S132). Thereby, as FIG. 28 illustrates, a via plug 116 is formed in the low-dielectric-constant insulating film 114.

As described above, a semiconductor device having a multi-layer wiring layer of a single Damascene structure is formed. Another wiring layer may further be laminated on the upper layer as required.

According to the fifth embodiment, as described above, two layers of masks described in the first to fourth embodiments are formed, and patterns are formed using these two layers of masks. Therefore, fine patterns can be formed faithfully to the pattern design, and a highly reliable semiconductor device can be obtained.

In the fifth embodiment, a contact plug 96, a metal wiring 106, and a via plug 116 are shown in the drawings for simplification. However, the present invention is not limited thereto, but required wiring layers can be formed on the required locations in the same manner as the fifth embodiment.

Also in the fifth embodiment, the formation of a semiconductor device having a multi-layer wiring layer of a single Damascene structure was described. However, the present invention can be widely applied to the cases wherein fine patterns must be formed, such as in the manufacture of other semiconductor devices and liquid-crystal devices.

Also in the fifth embodiment, the case wherein the combination of the hard mask and the resist mask was used for etching the silicon oxide film 94 in the formation of the contact hole 98 was described. Furthermore, in the formation of the hole 108 and the via hole 118, the use of two layers of hard masks was described. However, the present invention is not limited thereto, but the combination with other masks, such as the combination of two layers of hard masks described in the first embodiment, the combination of two layers of resist masks described in the fourth embodiment, and the combination of a hard mask and a resist mask, may also be used. These masks may be optionally selected considering the size of required patterns, productivity, and the like, as described above. However, for example, when etching is performed using a combination of hard masks, the material having a sufficiently large etching selectivity with the film to be processed (e.g., the silicon oxide film 94 and the like).

For example, by carrying out Step S2 of the first embodiment or Step S40 of the third embodiment, the step for forming the film to be processed of the present invention is carried out. Also for example, by carrying out Steps S4 to S16 of the first embodiment, or Steps S42 to S52 of the third embodiment, the step for forming the first mask of the present invention is carried out; and by carrying out Steps S18 to S32 of the first embodiment, or Steps S54 to S62 of the third embodiment, the step for forming the second mask of the present invention is carried out. By carrying out Steps S34 or S66 of the first or third embodiments, the etching step of the present invention is carried out.

Also for example, in the first embodiment, by carrying out Steps S4 and S18, the steps for forming the first and second material films of the present invention are carried out, respectively; by carrying out Steps S8 to S12 and S22 to S26, the steps for forming the first and second resist patterns of the present invention are carried out, respectively; and by carrying out Steps S14 and S30, the first and second etching steps are carried out, respectively.

Also for example, in the third embodiment, by carrying out Steps S44 and S56, the first and second resist applying steps are carried out, respectively; by carrying out Steps S48 to 52 and S56 to 62, the steps for forming the first and second resist masks are carried out, respectively; and by carrying out Step S64, the step for etching the anti-reflection coating is carried out.

The features and the advantages of the present invention as described above may be summarized as follows.

According to one aspect of the present invention, a first and a second photomask are used in exposure. The mask formed by combining the first and second masks formed on a film to be processed using the first and second photomasks is a mask opened only on the area of an actually formed real pattern. The film to be processed is etched using the first and second masks to form a desired pattern. Here, in the first mask, since the pattern pitch is controlled within a prescribed range, the pattern can be accurately formed even when a technique requiring periodicity in the pattern to some extent, such as a resolution enhancement technique is used. In addition, the second mask masks the unnecessary area of the pattern. Therefore, the pattern having the area out of periodicity can be formed faithfully to the pattern design.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2003-377439, filed on Nov. 6, 2003 including specification, claims, drawings and summary, on which the Convention priority of the present application is based, are incorporated herein by reference in its entirety.

What is claimed is:

1. A method for forming patterns comprising:
   forming, on a substrate, a film to be processed;
   forming a first mask, which is a hard mask, on said film to be processed, by lithography, using a first photomask, wherein forming said first mask includes
      forming a first material film that becomes the material film of said first mask on said film to be processed, forming a first resist pattern by transferring the pattern of said first photomask onto said first material film, using lithography, said first photomask having a real pattern, which is an actual pattern on said film to be processed, and a dummy pattern added to control pattern pitch in said first photomask to within a prescribed range for resolution enhancement of the real pattern of the first photomask, and etching said first material film using said first resist pattern as an etching mask;

forming a second mask, which is a hard mask, on said film to be processed and on said first mask, by lithography, using a second photomask, wherein forming said second mask includes forming a second material film that becomes the material film of said second mask on said film to be processed and on said first mask, forming a second resist pattern by transferring the pattern of said second photomask onto said second material film, using lithography, said second photomask having a pattern isolating a region in which said dummy pattern is formed from a region in which said real pattern is formed, and etching said second material film using said second resist pattern as an etching mask; and etching said film to be processed using said first mask and said second mask as etching masks.

2. The method for forming patterns according to claim 1, wherein said first mask is a silicon nitride film and said second mask is a silicon oxide film.

3. The method for forming patterns according to claim 1, including using a quadrapole illumination source for exposure in the lithography used in forming said first mask.

4. The method for forming patterns according to claim 1, including using a dipole illumination source for exposure in the lithography used in forming said first mask.

5. The method for forming patterns according to claim 1, including using a circular illumination source for exposure in the lithography used in forming said first mask.

6. The method for forming patterns according to claim 1, wherein said first photomask is an attenuated phase shifting mask.

7. The method for forming patterns according to claim 1, wherein said first photomask is an alternating phase shifting mask.

* * * * *